United States Patent
Fisher

(10) Patent No.: US 12,315,830 B2
(45) Date of Patent: May 27, 2025

(54) GROUP III NITRIDE-BASED MONOLITHIC MICROWAVE INTEGRATED CIRCUITS INCLUDING STATIC RANDOM ACCESS MEMORY BLOCKS WITH ASSOCIATED ADDRESSING AND BUFFERING CIRCUITS

(71) Applicant: Wolfspeed, Inc., Durham, NC (US)

(72) Inventor: Jeremy Fisher, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 567 days.

(21) Appl. No.: 17/737,431

(22) Filed: May 5, 2022

(65) Prior Publication Data

US 2023/0361059 A1    Nov. 9, 2023

(51) Int. Cl.
| | | |
|---|---|---|
| *H10B 10/00* | (2023.01) | |
| *G11C 5/06* | (2006.01) | |
| *H01L 23/66* | (2006.01) | |
| *H10D 62/85* | (2025.01) | |

(52) U.S. Cl.
CPC .............. *H01L 23/66* (2013.01); *G11C 5/063* (2013.01); *H10B 10/12* (2023.02); *H10B 10/18* (2023.02); *H10D 62/8503* (2025.01); *H01L 2223/6683* (2013.01)

(58) Field of Classification Search
CPC .. G11C 5/02; G11C 5/06; G11C 5/025; G11C 5/063; G11C 11/418; G11C 11/419; H10B 10/00; H10B 10/12; H10B 10/18; H10B 62/85; H10B 62/8503; H10B 30/47; H10B 30/475; H01L 23/66; H01L 2223/6683
USPC ......................................................... 257/728
See application file for complete search history.

(56) References Cited

U.S. PATENT DOCUMENTS

| | | | | |
|---|---|---|---|---|
| 2011/0280073 A1* | 11/2011 | Chiu | .................. | G11C 13/0004 365/185.08 |
| 2022/0180910 A1* | 6/2022 | Shaik | .................. | G11C 11/1675 |

OTHER PUBLICATIONS

"Anoop Gopinath, et al., "Leakage Current and Static Power Analysis of TFET 8T-SRAM Cell," Science Direct, Proceedings 7 (2019) 878-887".

Yong Cai, et al., "Y. Cai, Z. Cheng, W. C. W. Tang, K. M. Lau and K. J. Chen, "Monolithically Integrated Enhancement/Depletion-Mode AlGaN/GaN HEMT Inverters and Ring Oscillators Using\$hboxCF_4\$Plasma Treatment," in IEEE Transactions on Electron Devices, vol. 53, No. 9, pp. 2", Sep. 2006, 2223-2230.

\* cited by examiner

*Primary Examiner* — Chuong A Luu
(74) *Attorney, Agent, or Firm* — Myers Bigel, P.A.

(57) ABSTRACT

A monolithic microwave integrated circuit comprises a monolithic substrate, a Group III nitride-based channel layer on the monolithic substrate, a Group III nitride-based barrier layer on the monolithic substrate, a Group III nitride-based channel layer in between the monolithic substrate and the Group III nitride-based barrier layer, a radio frequency circuit that includes a plurality of depletion mode RF transistors that are formed in the Group III nitride-based channel and barrier layers, and a static random access memory ("SRAM") circuit that includes a SRAM block having a plurality of SRAM cells arranged in rows and columns, the SRAM circuit including a plurality of depletion mode transistors and a plurality of enhancement mode transistors that are formed in the Group III nitride-based channel and barrier layers.

26 Claims, 16 Drawing Sheets

GROUP III NITRIDE-BASED MONOLITHIC MICROWAVE INTEGRATED CIRCUITS INCLUDING STATIC RANDOM ACCESS MEMORY BLOCKS WITH ASSOCIATED ADDRESSING AND BUFFERING CIRCUITS

STATEMENT OF U.S. GOVERNMENT INTEREST

This invention was made with Government support under Contract No. D16PC00038 awarded by the Defense Advanced Research Projects Agency. The Government has certain rights in the invention.

FIELD

The inventive concepts described herein relate to monolithic microwave integrated circuits ("MMIC") devices and, more particularly, to Group III nitride-based MMIC devices.

BACKGROUND

Electrical circuits requiring high power handling capability while operating at high frequencies have become more prevalent. In particular, there is now high demand for RF amplifiers that are used to amplify radio frequency ("RF") signals at frequencies of, for example, 500 MHz and higher (including microwave frequencies). These RF amplifiers often need to exhibit high reliability, good linearity and handle high output power levels.

RF transistor amplifiers may be implemented in silicon or wide bandgap semiconductor materials, such as silicon carbide ("SiC") and Group III nitride-based materials. Herein, the term "wide bandgap" refers to semiconductor materials having a bandgap of greater than 1.40 eV. As used herein, the terms "Group III nitride" and "Group III nitride-based" refer to those semiconducting compounds formed between nitrogen and the elements in Group III of the periodic table, usually aluminum (Al), gallium (Ga), and/or indium (In). These terms also refer to ternary and quaternary compounds, such as AlGaN and AlInGaN. These compounds have empirical formulas in which one mole of nitrogen is combined with a total of one mole of the Group III elements. High power RF circuits, such as high power, high frequency RF transistor amplifiers, are often implemented in Group III nitride based materials and, in particular, in gallium nitride-based materials (i.e., a Group III nitride-based material that includes gallium). Group III nitride-based RF transistor amplifiers are typically implemented as High Electron Mobility Transistor ("HEMT") amplifiers.

A HEMT may be either a depletion mode device or an enhancement mode device, depending on whether the transistor is configured to be in an ON-state (conducting) or an OFF-state (non-conducting) at a gate-source voltage of zero. An enhancement mode HEMT is OFF at zero gate-source voltage, whereas a depletion mode HEMT is ON at zero gate-source voltage. HEMT-based RF transistor amplifiers are typically implemented as depletion mode devices, in that they are conductive at a gate-source bias of zero due to the polarization-induced charge at the interface of the barrier and channel layers of the device.

SUMMARY

Pursuant to embodiments of the present invention, monolithic microwave integrated circuits are provided that include a monolithic substrate, a Group III nitride-based channel layer on the monolithic substrate, a Group III nitride-based barrier layer on the monolithic substrate, a Group III nitride-based channel layer in between the monolithic substrate and the Group III nitride-based barrier layer, a radio frequency ("RF") circuit that includes a plurality of depletion mode RF transistors that are formed in the Group III nitride-based channel and barrier layers, and a static random access memory ("SRAM") circuit that includes a SRAM block having a plurality of SRAM cells arranged in rows and columns, the SRAM circuit including a plurality of depletion mode transistors and a plurality of enhancement mode transistors that are formed in the Group III nitride-based channel and barrier layers.

In some embodiments, the SRAM circuit may include a multi-bit addressing circuit that comprises a plurality of depletion mode RF transistors and a plurality of enhancement mode RF transistors that are formed in the Group III nitride-based channel and barrier layers.

In some embodiments, the SRAM circuit includes a first input buffer circuit, a first column enable circuit, a first sense amplifier and a first sense amplifier buffer circuit that each include a plurality of depletion mode RF transistors and a plurality of enhancement mode RF transistors that are formed in the Group III nitride-based channel and barrier layers.

In some embodiments, the SRAM circuit further includes a plurality of bit line pairs, each bit line pair including a respective bit line and a respective complementary bit line. In such embodiments, the first input buffer circuit, the first column enable circuit, the first sense amplifier and the first sense amplifier buffer circuit may each be associated with a first of the bit line pairs.

In some embodiments, the first input buffer circuit, the first column enable circuit, the first sense amplifier and the first sense amplifier buffer circuit are arranged in a column that extends from a first column of SRAM cells in the SRAM block, with the first sense amplifier buffer circuit directly adjacent the first column of memory cells, and the first sense amplifier and the first column enable circuit are in between the first sense amplifier buffer circuit and the first input buffer circuit.

In some embodiments, a first portion of the first column enable circuit is in between the first input buffer circuit and the first sense amplifier and/or a second portion of the first column enable circuit is positioned within a footprint of the first sense amplifier. In some embodiments, the first input buffer circuit comprises first through eight enhancement mode transistors, each of which have respective gate electrodes that extend in a first direction, and first and second depletion mode transistors, each of which have respective gate electrodes that extend in a second direction that is perpendicular to the first direction. In some embodiments, the first through fourth enhancement mode transistors are aligned along a first axis that extends in the first direction, and wherein the fifth through eighth enhancement mode transistors are arranged to define a rectangle. In some embodiments, the fifth through eighth enhancement mode transistors are positioned between the first through fourth enhancement mode transistors and the first column enable circuit. In some embodiments, the fifth through eighth enhancement mode transistors are positioned between a first axis defined by a longitudinal axis of the first depletion mode transistor and a second axis defined by a longitudinal axis of the second depletion mode transistor.

In some embodiments, the first column enable circuit comprises first through third enhancement mode transistors, each of which have respective gate electrodes that extend in a first direction, and first through fourth depletion mode transistors, each of which have respective gate electrodes that extend in a second direction that is perpendicular to the first direction. In some embodiments, gate electrodes of the first through third enhancement mode transistors are aligned along a third axis that extends in the first direction. In some embodiments, the first and second depletion mode transistors are on a first side of the third axis and the third and fourth depletion mode transistors are on a second side of the third axis that is opposite the first side. In some embodiments, at least part of a first enhancement mode transistor of the first sense amplifier is positioned between the third axis and the fourth depletion mode transistor of the first column enable circuit, and at least part of a second enhancement mode transistor of the first sense amplifier is positioned between the third axis and the third depletion mode transistor of the first column enable circuit.

In some embodiments, the first sense amplifier comprises first through fifth enhancement mode transistors, each of which have respective gate electrodes that extend in a first direction, and first and second depletion mode transistors, each of which have respective gate electrodes that extend in a second direction that is perpendicular to the first direction. In some embodiments, the third and fourth depletion mode transistors of the first column enable circuit are positioned between a fourth axis defined by the gate electrodes of the first and second enhancement mode transistors of the sense amplifier and a fifth axis defined by a longitudinal axis of the third enhancement mode transistor of the sense amplifier. In some embodiments, the first enhancement mode transistor of the sense amplifier is electrically coupled in series along the complementary bit line and the second enhancement mode transistor of the sense amplifier is electrically coupled in series along the bit line. In some embodiments, the first and second enhancement mode transistors of the sense amplifier are aligned along the fourth axis, and the fourth and fifth enhancement mode transistors of the sense amplifier are aligned along a sixth axis that extends in the first direction. In some embodiments, a first part of a source/drain electrode of the third enhancement mode transistor of the sense amplifier comprises a second source/drain electrode of the fourth enhancement mode transistor of the sense amplifier. In some embodiments, a second part of the first source/drain electrode of the third enhancement mode transistor of the sense amplifier comprises a second source/drain electrode of the fifth enhancement mode transistor of the sense amplifier.

In some embodiments, the first sense amplifier buffer circuit comprises first through seventh enhancement mode transistors, each of which have respective gate electrodes that extend in a first direction, and first and second depletion mode transistors, each of which have respective gate electrodes that extend in a second direction that is perpendicular to the first direction. In some embodiments, the seventh enhancement mode transistor of the first sense amplifier buffer circuit overlaps the first through sixth enhancement mode transistors of the first sense amplifier buffer circuit in the second direction.

In some embodiments, the monolithic microwave integrated circuit may further include a first pre-charge depletion mode transistor that has a gate electrode that is coupled to a gate electrode of the first enhancement mode transistor of the first sense amplifier buffer circuit and a second pre-charge depletion mode transistor that has a gate electrode that is coupled to a gate electrode of the second enhancement mode transistor of the first sense amplifier buffer circuit. In some embodiments, the first through seventh enhancement mode transistors and the first and second depletion mode transistors of the first sense amplifier buffer circuit are positioned in a region between the first bit line and the first complementary bit line, while the first pre-charge depletion mode transistor and the second pre-charge depletion mode transistor are positioned outside the region between the first bit line and the first complementary bit line.

In some embodiments, a first of the SRAM cells includes first through fourth enhancement mode transistors and first and second depletion mode transistors, wherein the third and fourth enhancement mode transistors are positioned in between the first and second depletion mode transistors. In some embodiments, gate electrodes of the first through fourth enhancement mode transistors each extend in a first direction, and the first enhancement mode transistor overlaps the third enhancement mode transistor in a second direction that is perpendicular to the first direction. In some embodiments, the second enhancement mode transistor overlaps the fourth enhancement mode transistor in the second direction. In some embodiments, the bit line extends between the first depletion mode transistor and the third enhancement mode transistor. In some embodiments, the complementary bit line extends between the second depletion mode transistor and the fourth enhancement mode transistor.

In some embodiments, the bit line and the complementary bit line each extend between the first depletion mode transistor and the second depletion mode transistor.

Pursuant to further embodiments of the present invention, monolithic microwave integrated circuits are provided that comprise a monolithic substrate, a Group III nitride-based channel layer on the monolithic substrate, a Group III nitride-based barrier layer on the monolithic substrate, a Group III nitride-based channel layer in between the monolithic substrate and the Group III nitride-based barrier layer, and a static random access memory ("SRAM") circuit that includes a SRAM block having a column of SRAM cells and a first bit line and a first complementary bit line that electrically connected to each SRAM cell in the column of SRAM cells. A first of the SRAM cells includes first through fourth enhancement mode transistors and first and second depletion mode transistors that are formed in the Group III nitride-based channel and barrier layers, and the third and fourth enhancement mode transistors and first and second depletion mode transistors that are formed in the Group III nitride-based channel and barrier layers. The first bit line extends between the first depletion mode transistor and the third enhancement mode transistor and the first complementary bit line extends between the second depletion mode transistor and the fourth enhancement mode transistor.

In some embodiments, gate electrodes of the first through fourth enhancement mode transistors each extend in a first direction, and the first enhancement mode transistor overlaps the third enhancement mode transistor in a second direction that is perpendicular to the first direction. In some embodiments, the second enhancement mode transistor overlaps the fourth enhancement mode transistor in the second direction. In some embodiments, the first enhancement mode transistor overlaps the second enhancement mode transistor in the first direction, and the third enhancement mode transistor overlaps the fourth enhancement mode transistor in the first direction. In some embodiments, the first depletion mode transistor overlaps the third enhancement mode transistor in the first direction, and the second depletion mode transistor overlaps the fourth enhancement mode transistor in the first direction.

Pursuant to still further embodiments of the present invention monolithic microwave integrated circuits are provided that comprise a monolithic substrate, a Group III nitride-based channel layer on the monolithic substrate, a Group III nitride-based barrier layer on the monolithic substrate, a Group III nitride-based channel layer in between the monolithic substrate and the Group III nitride-based barrier layer, and a SRAM circuit that includes a SRAM block having a column of SRAM cells, a first bit line and a first complementary bit line that electrically connected to each SRAM cell in the column of SRAM cells, a first column enable circuit and a first input buffer circuit, the first input buffer circuit comprising first through eight enhancement mode transistors, each of which have respective gate electrodes that extend in a first direction, and first and second depletion mode transistors, each of which have respective gate electrodes that extend in a second direction that is perpendicular to the first direction.

In some embodiments, the first through fourth enhancement mode transistors of the first input buffer circuit are aligned along a first axis that extends in the first direction, and wherein the fifth through eighth enhancement mode transistors of the first input buffer circuit are arranged to define a rectangle. In some embodiments, the fifth through eighth enhancement mode transistors of the first input buffer circuit are positioned between the first through fourth enhancement mode transistors of the first input buffer circuit and the first column enable circuit. In some embodiments, the fifth through eighth enhancement mode transistors of the first input buffer circuit are positioned between a first axis defined by a longitudinal axis of the first depletion mode transistor of the first input buffer circuit and a second axis defined by a longitudinal axis of the second depletion mode transistor of the first input buffer circuit.

In some embodiments, the first column enable circuit comprises first through third enhancement mode transistors, each of which have respective gate electrodes that extend in a first direction, and first through fourth depletion mode transistors each of which have respective gate electrodes that extend in a second direction that is perpendicular to the first direction. In some embodiments, gate electrodes of the first through third enhancement mode transistors of the first column enable circuit are aligned along a third axis that extends in the first direction. In some embodiments, the first and second depletion mode transistors of the first column enable circuit are on a first side of the third axis and the third and fourth depletion mode transistors of the first column enable circuit are on a second side of the third axis that is opposite the first side. In some embodiments, the SRAM circuit further includes a first sense amplifier that comprises first through fifth enhancement mode transistors, each of which have respective gate electrodes that extend in the first direction, and first and second depletion mode transistors, each of which have respective gate electrodes that extend in the second direction.

In some embodiments, at least part of a first enhancement mode transistor of the first sense amplifier is positioned between the third axis and the fourth depletion mode transistor of the first column enable circuit, and at least part of a second enhancement mode transistor of the first sense amplifier is positioned between the third axis and the third depletion mode transistor of the first column enable circuit. In some embodiments, the third and fourth depletion mode transistors of the first column enable circuit are positioned between a fourth axis defined by the gate electrodes of the first and second enhancement mode transistors of the sense amplifier and a fifth axis defined by a longitudinal axis of the third enhancement mode transistor of the sense amplifier. In some embodiments, the first enhancement mode transistor of the sense amplifier is electrically coupled in series along the complementary bit line and the second enhancement mode transistor of the sense amplifier is electrically coupled in series along the bit line.

In some embodiments, the first and second enhancement mode transistors of the sense amplifier are aligned along the fourth axis, and the fourth and fifth enhancement mode transistors of the sense amplifier are aligned along a sixth axis that extends in the first direction. In some embodiments, a first part of a first source/drain electrode of the third enhancement mode transistor of the sense amplifier comprises a second source/drain electrode of the fourth enhancement mode transistor of the sense amplifier. In some embodiments, a second part of the first source/drain electrode of the third enhancement mode transistor of the sense amplifier comprises a second source/drain electrode of the fifth enhancement mode transistor of the sense amplifier.

In some embodiments, the SRAM circuit further includes a first sense amplifier buffer circuit that comprises first through seventh enhancement mode transistors, each of which have respective gate electrodes that extend in the first direction, and first and second depletion mode transistors, each of which have respective gate electrodes that extend in the second direction. In some embodiments, the seventh enhancement mode transistor of the first sense amplifier buffer circuit overlaps the first through sixth enhancement mode transistors of the first sense amplifier buffer circuit in the second direction.

In some embodiments, the monolithic microwave integrated circuit further includes a first pre-charge depletion mode transistor that has a gate electrode that is coupled to a gate electrode of the first enhancement mode transistor of the first sense amplifier buffer circuit and a second pre-charge depletion mode transistor that has a gate electrode that is coupled to a gate electrode of the second enhancement mode transistor of the first sense amplifier buffer circuit.

In some embodiments, the first through seventh enhancement mode transistors and the first and second depletion mode transistors of the first sense amplifier buffer circuit are positioned in a region between the first bit line and the first complementary bit line, while the first pre-charge depletion mode transistor and the second pre-charge depletion mode transistor are positioned outside the region between the first bit line and the first complementary bit line.

DETAILED DESCRIPTION

The operation of Group III nitride-based RF transistor amplifiers and other Group III nitride-based RF semiconductor devices are typically controlled by external control signals. These control signals may be generated by associated digital circuits that are typically implemented as silicon-based semiconductor devices that are formed in one or more separate semiconductor chips or "die." These associated circuits may include, for example, processor circuit(s), memory circuit(s), bias voltage circuits and the like. In many cases, commercially available digital circuits are used to generate the control signals that are supplied to a Group III nitride-based power semiconductor device.

While silicon-based digital control circuits tend to be inexpensive as compared to Group III nitride-based circuits, there are a number of potential disadvantages to using such silicon-based circuits. First, silicon-based circuits do not support operation at higher temperatures. As such, silicon-based circuits (and other non-Group III nitride-based circuits) typically are not suitable for use in applications having high output power levels. Second, the Group III nitride-based circuits and the silicon-based circuits are necessarily implemented on different die, and hence a circuit implemented using both Group III nitride-based circuits and silicon-based circuits area will be larger than a corresponding circuit that was completely implemented on a single die. Additionally, each die typically needs its own set of external connections to voltage/current sources and has its own input and output circuits, and hence the more die that are provided, the greater the number of connections. This further increases the size of the overall circuit, complicates fabrication, and results in more potential points of failure.

Figure 1:
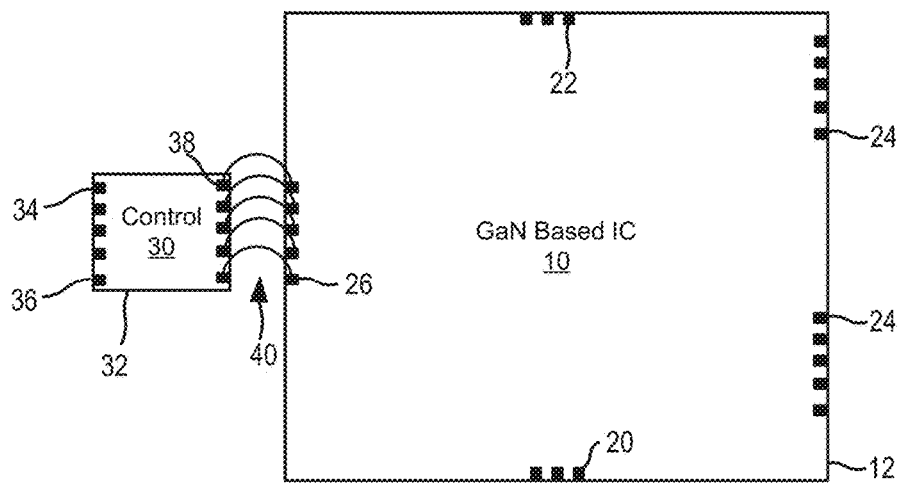
FIG. 1 is a schematic plan view of a conventional Group III nitride-based semiconductor device that is controlled using digital control signals supplied from an external control circuit.

FIG. 1 is a schematic plan view of a conventional Group III nitride-based power RF semiconductor device that is controlled using digital control signals that are supplied from an external circuit. As shown in FIG. 1, a Group III nitride-based integrated circuit chip 10 is provided. The Group III nitride-based integrated circuit chip 10 may include a base substrate 12 such as, for example, a silicon carbide semiconductor substrate that has a plurality of Group III nitride-based epitaxial layers formed thereon to form a semiconductor layer structure. Various input/output pads may be formed on the semiconductor layer structure including, for example, RF input pads 20, RF output pads 22, bias signal pads 24 and control signal pads 26. A control circuit integrated circuit chip 30 may also be provided. The control circuit integrated circuit chip 30 may be implemented on a second semiconductor substrate 32, which may comprise, for example, a silicon substrate. The control circuit integrated circuit chip 30 may include various pads formed thereon including, for example, bias signal pads 34, control signal input pads 36 and control signal output pads 38. While FIG. 1 illustrates a single control circuit integrated circuit chip 30, it will be appreciated that a plurality of separate control circuit integrated circuit chips 30 may be needed to generate the necessary control signals, particularly if off-the-shelf digital circuits are used to form the control circuitry.

In some cases (such as the example of FIG. 1), the Group III nitride-based integrated circuit chip 10 and the control circuit integrated circuit chip 30 may be mounted in a single package. A plurality of bond wires or other interconnections 40 may be provided that connect various output pads 38 included in control circuit integrated circuit chip 30 to input pads 20 included in the gallium nitride based integrated circuit chip 10. In other cases, the two integrated circuit chips 10, 30 may be packaged separately and interconnected, for example, via control lines on a printed circuit board and/or bond wires. In either case, interconnecting the two integrated circuit chips 10, 30 tends to add additional complexity and expense to the fabrication process, and also may reduce the performance of the device.

There are certain applications where a control circuit for a Group III nitride-based RF semiconductor device requires a static random access memory ("SRAM") circuit. A SRAM memory circuit refers to a random access memory that retains data stored therein so long as power is supplied thereto. Typically, Group III nitride-based RF semiconductor devices are formed using depletion mode (normally on) transistors. The memory cells of a SRAM circuit are implemented using a combination of both enhancement mode and depletion mode transistors. Unfortunately, it may be challenging to implement both enhancement mode and depletion mode transistors on a common Group III nitride-based semiconductor die. Consequently, Group III nitride-based circuits that require SRAM circuits have been implemented using D-Flip-Flop based SRAM circuits that are formed using NAND logic gates. D-Flip-Flop based SRAM circuits, however, require a large amount of area on the semiconductor die and use large amounts of power. As such, the use of D-Flip-Flop based SRAM circuits are typically only practical in applications requiring a very small amount of memory.

A monolithic microwave integrated circuit ("MMIC") refers to an integrated circuit that operates on radio frequency signals in which all of the circuitry for a particular function is integrated into a single semiconductor chip. Pursuant to embodiments of the present invention, Group III nitride-based MMICs are provided that include both an RF circuit and a SRAM circuit. In other words, both the RF circuit and the SRAM circuit are implemented on a single monolithic semiconductor layer structure. These Group III nitride-based MMICs are implemented using both enhancement mode and depletion mode high electron mobility transistors that are formed on a common die. The SRAM circuit includes both a plurality of individual SRAM memory cells ("SRAM cells") that form a SRAM memory block as well as associated buffering and addressing circuits that are used to write data to the SRAM cells and to read data from the SRAM cells. The SRAM circuits included in the MMICs according to embodiments of the present invention may be very compact. For example, they may be an order of magnitude smaller than a comparable D-Flip-Flop based SRAM circuit, and may also use an order of magnitude less power. While the present application focuses on monolithic integrated circuits that include an RF circuit as well as a SRAM circuit, it will be appreciated that embodiments of the present invention are not limited thereto. For example, in other embodiments, the SRAM circuits according to embodiments of the present invention (including the SRAM block and associated buffering and addressing circuits) may be implemented as a stand alone circuit or may be implemented in conjunction with other digital and/or analog circuits on a monolithic substrate. For example, some non-RF applications may require operation at high temperatures (e.g., due to the environment or because the circuit is incorporated in a device that operates at high temperature) and the SRAM circuits according to embodiments of the present invention may be well-suited for use in such applications, either by themselves or implemented with other digital or analog circuits on a monolithic substrate.

The MMICs according to embodiments of the present invention may be implemented using the techniques disclosed in U.S. Pat. No. 10,516,043 ("the '043 patent"), entitled Monolithic Microwave Integrated Circuits Having Both Enhancement-Mode and Depletion Mode Transistors, the entire content of which is incorporated herein by reference. The '043 patent discloses Group III nitride-based semiconductor devices that include a Group III nitride-based epitaxial structure that is formed on a substrate such as, for example, a silicon carbide substrate. The Group III nitride-based epitaxial structure may include, for example, a Group III nitride-based channel layer and a Group III nitride-based barrier layer that is formed on the channel layer opposite the substrate. Gate, drain and source electrodes are formed directly on the barrier layer opposite the channel layer to form depletion mode transistors. Enhancement mode transistors are fabricated by forming openings that extend at least partially through the barrier layer, and then forming "recessed" gate electrodes within these openings. Source and drain electrodes are formed directly on the barrier layer on either side of the recessed gate electrodes to complete the enhancement mode transistors. In some cases, the openings for the recessed gate electrodes of the enhancement mode transistors may extend all of the way through the barrier layer and optionally into the channel layer. In such embodiments, a gate insulating layer such as, for example, an oxide layer (e.g., $SiO_2$) may be formed in the openings to electrically isolate the recessed gate electrodes from the channel layer. In other embodiments, the openings may only extend part of the way through the barrier layer, and the gate insulating layer may be omitted.

The Group III nitride-based semiconductor devices according to embodiments of the present invention may be smaller, cheaper and less complex as compared to conventional multi-chip circuits that provide the same functionality or monolithic designs that implement the memory cells using D-Flip-Flop circuits. Moreover, the SRAM circuit included therein may be formed using the same metal layers included in the RF circuit, and thus may be efficiently implemented. These devices may have various performance advantages as compared to conventional multi-chip or D-Flip-Flop based solutions including faster operating speeds, reduced size and cost and/or reduced power consumption.

Embodiments of the present invention will now be described in greater detail with reference to FIGS. 2A-11G.

Figure 2A:
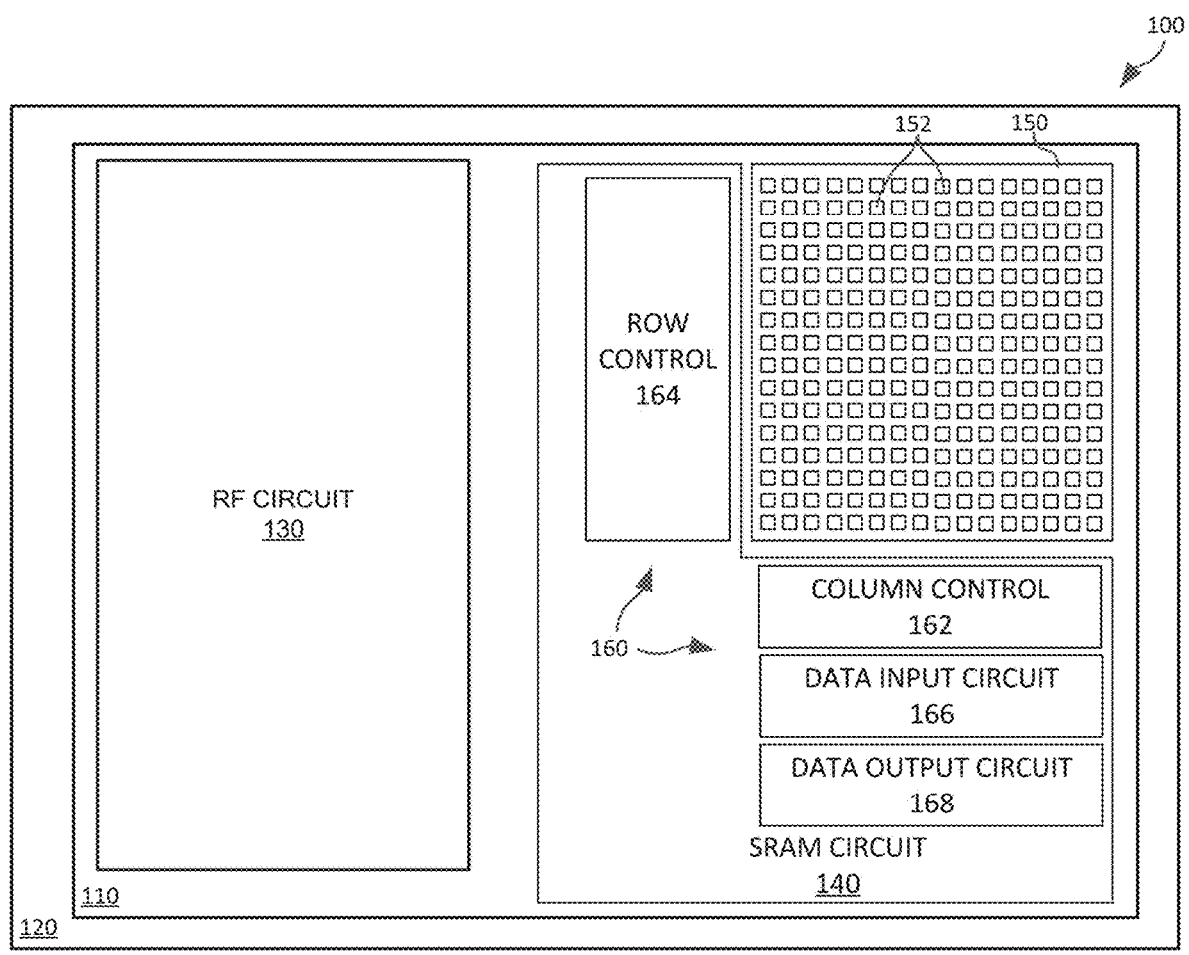
FIG. 2A is a schematic block diagram of a Group III nitride-based semiconductor device according to embodiments of the present invention that includes both an RF circuit and a static random access memory ("SRAM") circuit on a single monolithic die.

FIG. 2A is a schematic block diagram of a Group III nitride-based semiconductor device 100 according to embodiments of the present invention. As shown in FIG. 2A, the semiconductor device 100 includes a single monolithic semiconductor die 110. The die 110 may, in some cases, be incorporated into a protective package 120. The die 110 may be the only semiconductor die within the package 120, or additional semiconductor die (not shown) may also be included in the package 120. If multiple semiconductor die are included, electrical interconnections (e.g., bond wire connections) may extend between the multiple semiconductor die.

As is further shown in FIG. 2A, the monolithic die 110 includes an RF circuit 130 and a SRAM circuit 140. The RF circuit 130 may comprise any type of RF circuit, such as an RF transistor amplifier circuit, an RF switch, an RF transmit/receive circuit, an RF variable attenuator, an RF phase shifter and/or other implementations of multifunction RF circuits. The SRAM circuit 140 may include a SRAM block 150 and a SRAM peripheral circuit 160. The SRAM block 150 includes a plurality of individual SRAM cells 152 which may be arranged, for example in rows and columns. In the depicted embodiment, the SRAM block is a 16×16 SRAM block that includes sixteen rows and sixteen columns of SRAM cells 152, for a total of 256 SRAM cells 152. The SRAM peripheral circuit 160 includes address and buffering circuits that are used to write data into the individual SRAM cells 152 and to read data therefrom. The address and buffering circuits include, among other things, a plurality of column control circuits 162 that are used to select one of the columns of SRAM cells 152 of the SRAM block 150, a plurality of row control circuits 164 that are used to select one of the rows of SRAM cells 152 of the SRAM block 150, a plurality of data input circuits 166 that are used to buffer data that is to be written to a selected SRAM cell 152, and a plurality of data output circuits that are used to read data from a selected SRAM cell 152. It will be appreciated that the 16×16 SRAM block discussed herein is simply an example of one SRAM circuit according to embodiments of the present invention. It will be appreciated that the number of memory cells may be smaller or larger than 256 and that smaller or larger word sizes may be used and/or the number of words may be changed in the SRAM circuits according to embodiments of the present invention.

Figure 2B:
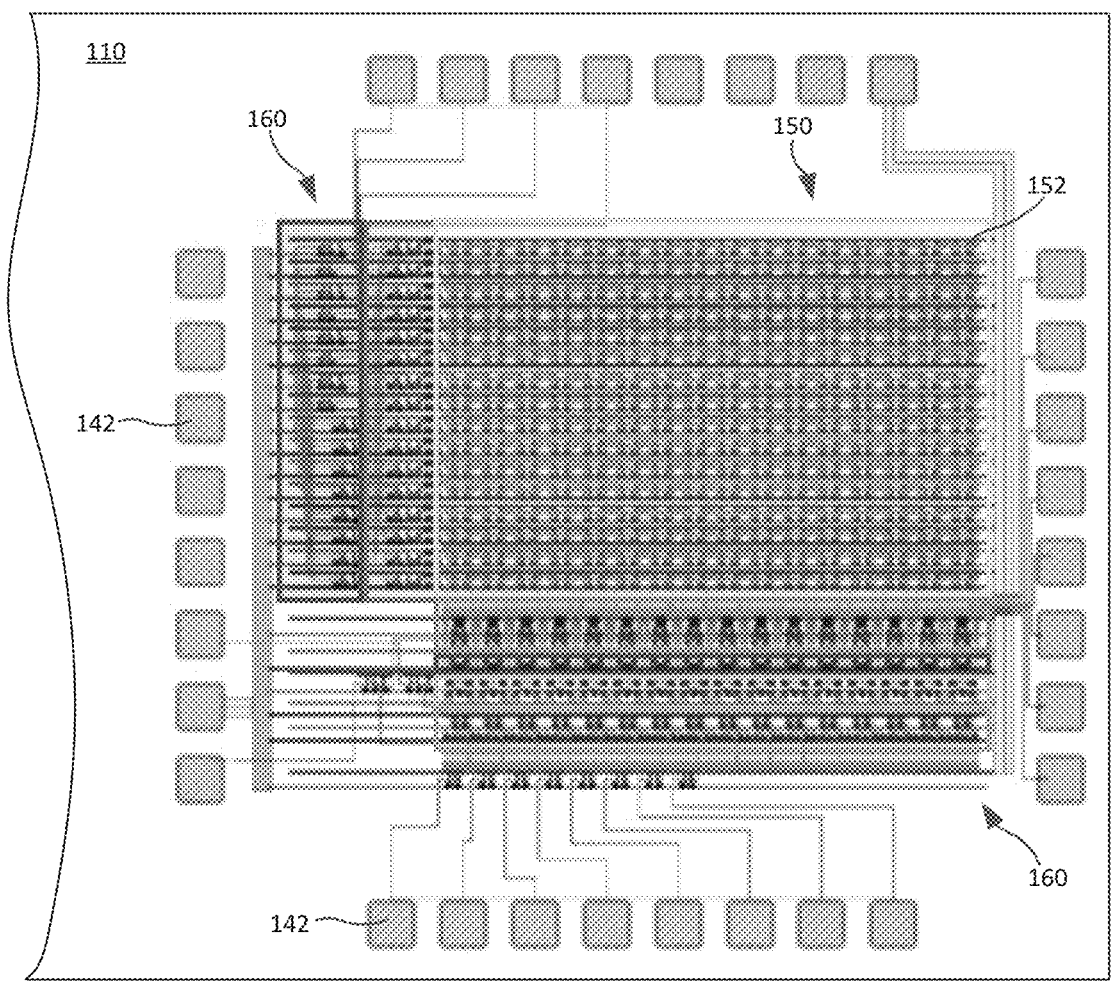
FIG. 2B is a plan view of an implementation of the SRAM circuit included in the semiconductor device of FIG. 2A.

FIG. 2B is a plan view of an implementation of the SRAM circuit 140 included in the semiconductor device 100 of FIG. 2A. As shown in FIG. 2B, the SRAM circuit 140 is formed on and in the semiconductor die 110. The SRAM block 150 and the associated SRAM peripheral circuits 160 are formed in a central region, and a plurality of associated pads 142 may at least partially surround the SRAM block 150 and SRAM peripheral circuits 160. The pads 142 may include bias voltage pads (e.g., voltage sources for one or more power supply voltages $V_{DD}$ and ground voltages GND), control pads and data input/output pads. The pads may be connected by transmission line structures such as metal traces and/or vias to the SRAM peripheral circuit 160. The pads 142 may be implemented as metal pads on the semiconductor die 110.

Figure 2C:
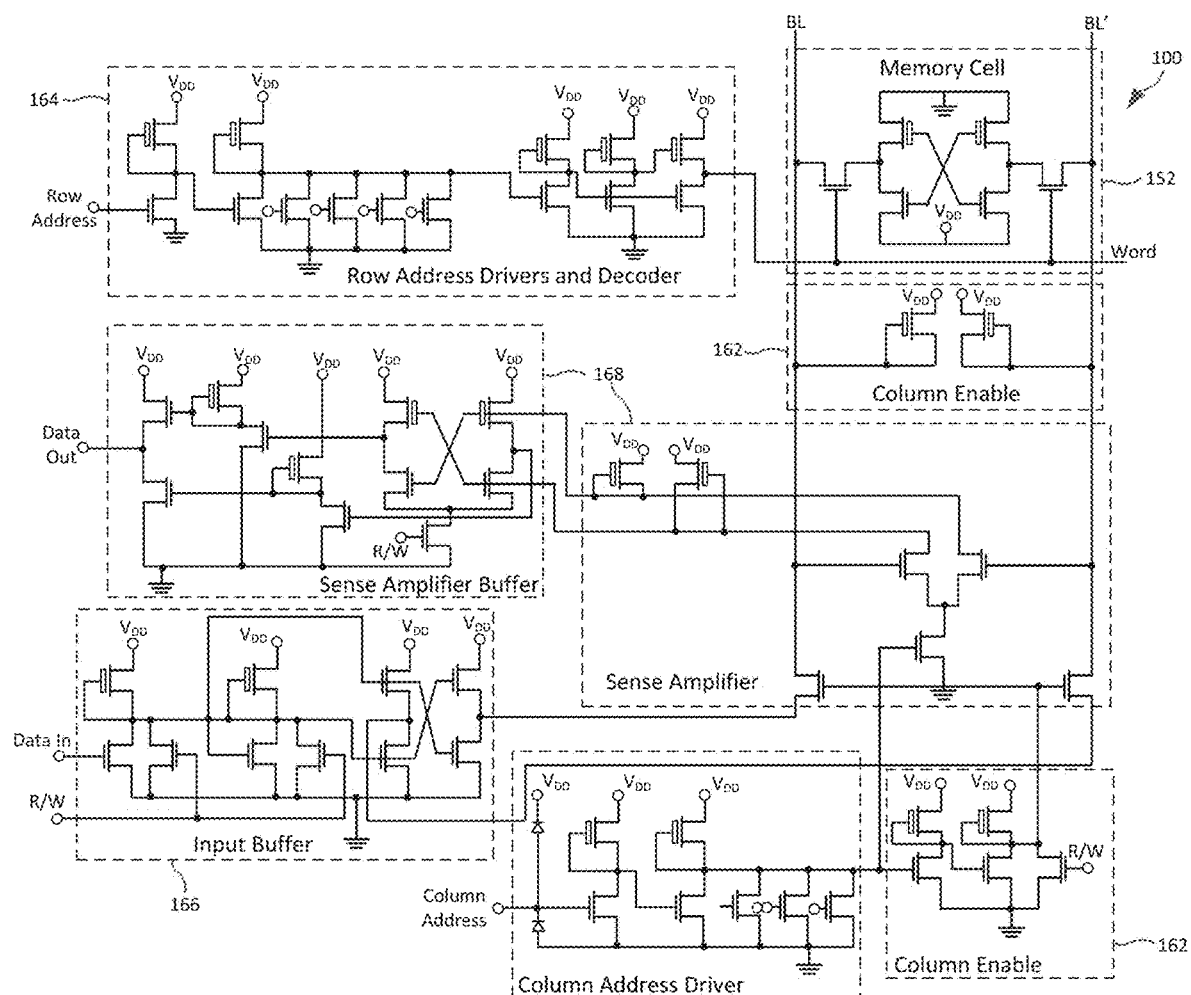
FIG. 2C is a circuit diagram of a portion of the SRAM circuit of FIG. 2B.

FIG. 2C is a circuit diagram of a portion of the SRAM circuit 140 of FIG. 2B. In particular, FIG. 2C is a circuit diagram of one of the SRAM cells 152, along with the column control circuit 162, the row control circuit 164, the data input circuit 166, and the data output buffer 168 that are connected to the depicted SRAM cell 152. Since the SRAM block 150 includes sixteen rows and columns of SRAM cells, it will be appreciated that the SRAM circuit 140 will include sixteen of the column control circuits 162, sixteen of the row control circuits 164, sixteen of the data input circuits 166, and sixteen of the data output circuits 168, and a total of 256 SRAM cells 152. The individual circuits illustrated in the circuit diagram of FIG. 2C will be discussed in greater detail below with reference to enlarged views of these circuits that are provided at FIGS. 4A, 6A, 7A, 8A, 9A, 10A and 11A.

Figure 3:
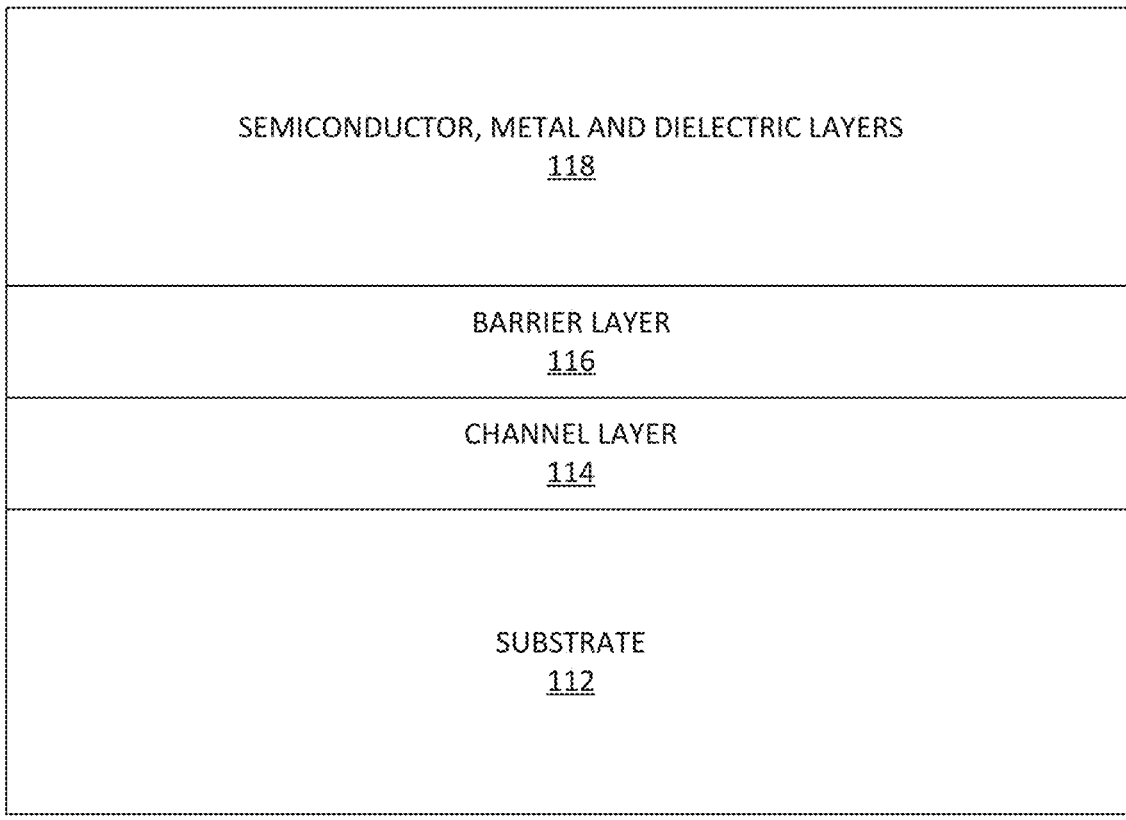
FIG. 3 is a schematic cross-sectional view of the semiconductor die of FIG. 2A.

FIG. 3 is a schematic cross-sectional view of the semiconductor die 110 of FIG. 2A in which the SRAM circuit 140 of FIGS. 2B-2C is formed. As shown in FIG. 3, the semiconductor die 110 is a single monolithic structure. The monolithic die 110 may comprise, for example, a substrate 112, a Group III nitride-based channel layer 114 that is formed on an upper surface of the substrate 112, and a Group III nitride-based barrier layer 116 that is formed on an upper surface of the Group III nitride-based channel layer 114. Additional semiconductor layers, metal layers and dielectric layers 118 are formed on an upper surface of the Group III nitride-based barrier layer 116. The substrate 112 may comprise, for example, a silicon carbide ("SiC") semiconductor substrate 112 such as a 4H-SiC or 6H-SiC substrate. Other example substrate materials that may be used include sapphire, aluminum nitride, aluminum gallium nitride, gallium nitride, silicon, GaAs, LGO, ZnO, LAO, InP and the like.

In many cases, the Group III nitride-based epitaxial layers are gallium nitride-based epitaxial layers such as GaN, AlGaN, InAlGaN and the like and hence the description below assumes that the Group III nitride-based epitaxial layers are gallium nitride-based layers, although it will be appreciated that embodiments of the present invention are not limited thereto.

The Group III nitride-based channel layer 114 may comprise, for example, a gallium nitride-based channel layer, such as $Al_xGa_{1-x}N$, where $0 \leq x < 1$. In an example embodiment, the channel layer 114 may be undoped or unintentionally doped and may be grown to a thickness of greater than about 20 Å. In other embodiments, the Group III nitride-based channel layer 114 may be a multi-layer structure, such as a superlattice, and may include combinations of GaN, AlGaN and the like. It will also be appreciated that additional epitaxial layers (not shown) such as, for example buffer, nucleation, transition and/or strain balancing layers may be provided (1) between the channel layer and the substrate, (2) between the channel layer and the barrier layer, and/or (3) on an upper surface of the barrier layer. For example, an aluminum nitride buffer layer may be included to provide an appropriate crystal structure transition between the silicon carbide substrate 112 and the gallium nitride-based channel layer 114.

The Group III nitride-based barrier layer 116 may be a gallium nitride-based barrier layer 116. A bandgap of a lower portion of the gallium nitride-based barrier layer 116 that contacts an upper surface of the gallium nitride-based channel layer 114 may exceed the bandgap of the uppermost layer of the gallium nitride-based channel layer 114. Additionally, the gallium nitride-based channel layer 114 may have a larger electron affinity than the gallium nitride-based barrier layer 116. The energy of the conduction band edge of the gallium nitride-based channel layer 114 is less than the energy of the conduction band edge of the gallium nitride-based barrier layer 116 at the interface therebetween. In certain embodiments, the gallium nitride-based barrier layer 116 is AlN, AlInN, AlGaN or AlInGaN, or combinations of layers thereof, with a thickness of between about 0.1 nm and about 30 nm. In some embodiments of the present invention, the gallium nitride-based barrier layer 116 is $Al_xGa_{1-x}N$ where $0<x<1$ (e.g., x=20-30%). In some embodiments, the gallium nitride-based barrier layer 116 may be undoped or doped with an n-type dopant to a concentration less than about $10^{19}$ cm$^{-3}$.

A plurality of additional semiconductor, metal and/or dielectric layers 118 are formed on an upper surface of the gallium nitride-based barrier layer 116. The semiconductor and/or metal layers may act as electrodes, as conductive plugs, as contacts/pads, as transmission lines, as resistors, etc. The dielectric layers may insulate portions of the metal layers and the semiconductor layers from each other.

Figure 4A:
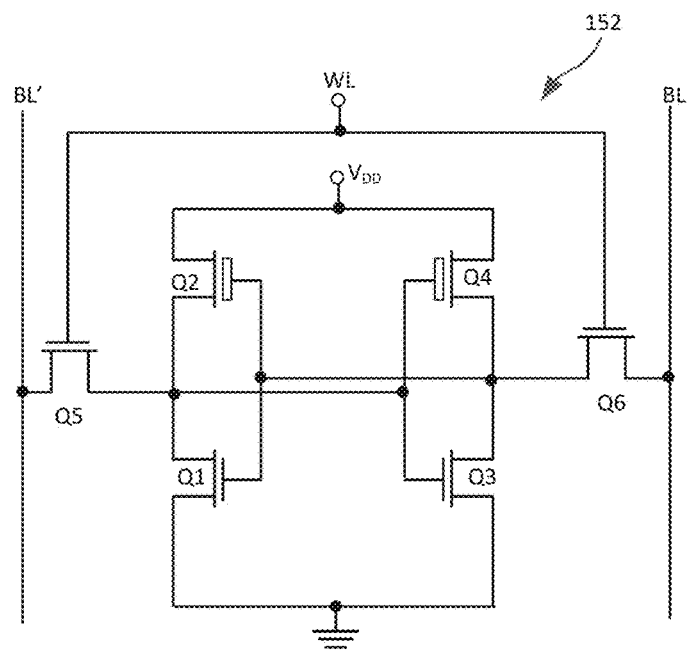
FIG. 4A is a circuit diagram of one of the SRAM cells included in the Group III nitride-based semiconductor device of FIGS. 2A-2C.

FIG. 4A is a circuit diagram of one of the SRAM cells 152 that is included in the SRAM block 150 of FIGS. 2A-2C. The SRAM cell 152 may have a conventional circuit design. The SRAM cell 152 includes a total of six transistors Q1-Q6. Transistors Q2 and Q4 are implemented as depletion mode transistors while transistors Q1, Q3, Q5 and Q6 are implemented as enhancement mode transistors. As shown in FIG. 4A, a first source/drain electrode of transistor Q6 is coupled to a bit line BL, while a second source/drain electrode of transistor Q6 is commonly coupled to (a) the gate electrode of transistor Q2, (b) the gate electrode of transistor Q1, (c) a second source/drain electrode of transistor Q4, and (d) a first source/drain electrode of transistor Q3. The gate electrode of transistor Q6 is coupled to a word line WL. Similarly, a first source/drain electrode of transistor Q5 is coupled to a complementary bit line BL', while a second source/drain electrode of transistor Q5 is commonly coupled to (a) the gate electrode of transistor Q4, (b) the gate electrode of transistor Q3, (c) a second source/drain electrode of transistor Q2, and (d) a first source/drain electrode of transistor Q1. The gate electrode of transistor Q5 is coupled to the word line WL. A first source/drain electrode of transistor Q2 is coupled to a power supply voltage VDD, and a first source/drain electrode of transistor Q4 is also coupled to the power supply voltage VDD. The second source/drain electrodes of transistors Q1 and Q2 are coupled to ground.

Figure 4B:
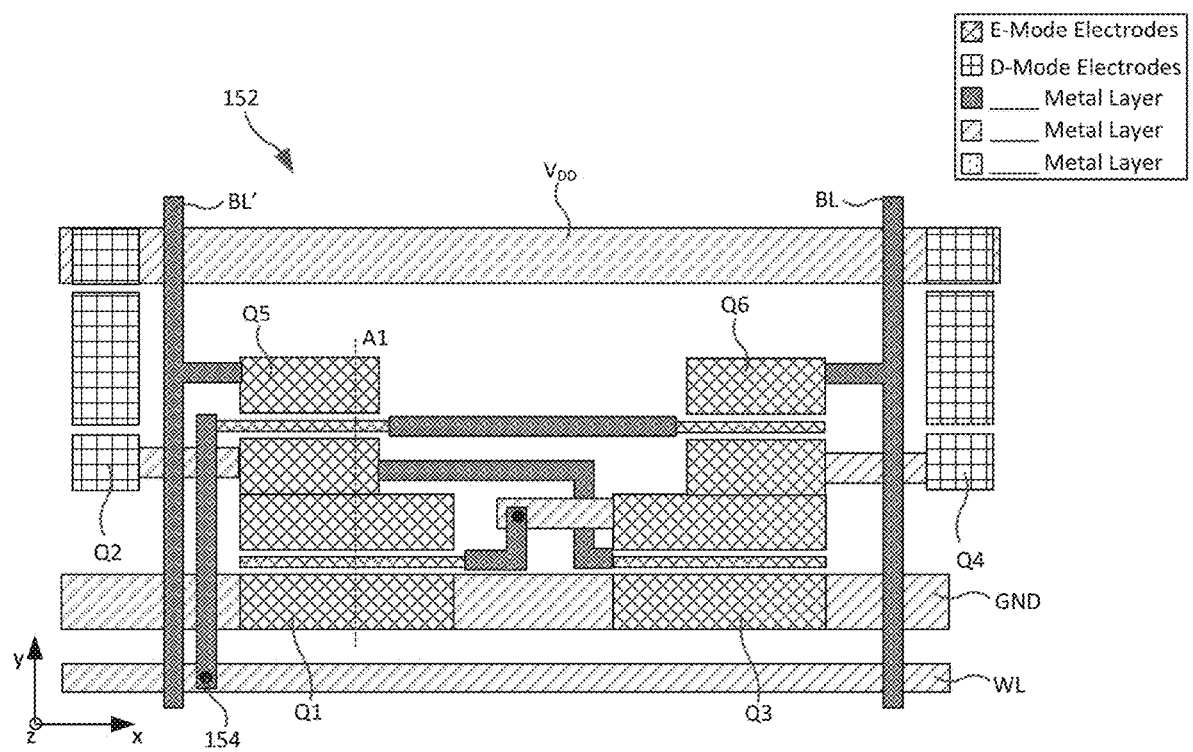
FIG. 4B is a greatly enlarged plan view of one of the SRAM cells included in the Group III nitride-based semiconductor device of FIGS. 2A-2C.

FIG. 4B is an enlarged plan view of an implementation of the SRAM cell of FIG. 4A. The SRAM cell 152 of FIG. 4B may be used to implement each of SRAM cells 152 in the SRAM block 150 of FIGS. 2A-2C. The transistors Q1-Q6 included in SRAM cell 152 are formed in an upper surface of the semiconductor die 110. A legend is provided in FIG. 4B that identifies what the different forms of cross-hatching refer to. This legend applies equally to FIGS. 5, 6B, 7B, 8B, 9B, 10B and 11B.

As shown in FIG. 4B, gate electrodes of the first through fourth enhancement mode transistors Q1, Q3, Q5-Q6 each extend in the x-direction. All four enhancement mode transistors Q1, Q3, Q5 and Q6 are formed in between the bit line BL and the complementary bit line BL'. Enhancement mode transistor Q1 overlaps enhancement mode transistor Q5 in a second direction (the y-direction) and overlaps enhancement mode transistor Q3 in a first direction (the x-direction). Herein, a first element "overlaps" a second element in a given direction (e.g., the x-direction or the y-direction) if an axis can be drawn that extends in the given direction that intersects both the first and second elements. For clarity, an axis Al is shown in FIG. 4B that illustrates how enhancement mode transistors Q1 and Q5 overlap in the second direction. Enhancement mode transistor Q6 overlaps enhancement mode transistor Q3 in the y-direction and overlaps enhancement mode transistor Q5 in the x-direction. Thus, the four enhancement mode transistors Q1, Q3, Q5 and Q6 may define a rectangle. The third and fourth enhancement mode transistors Q5, Q6 are positioned in between the first and second depletion mode transistors Q2, Q4. Depletion mode transistor Q2 is formed on an opposite side of complementary bit line BL' from enhancement mode transistors Q1, Q3, Q5 and Q6, and depletion mode transistor Q4 is formed on an opposite side of bit line BL from enhancement mode transistors Q1, Q3, Q5 and Q6. Thus, the bit line BL extends between the first depletion mode transistor Q2 and the third enhancement mode transistor Q5, and the complementary bit line BL' extends between the second depletion mode transistor Q4 and the fourth enhancement mode transistor Q6. The bit line BL and the complementary bit line BL' both extend between the first depletion mode transistor Q2 and the second depletion mode transistor Q4. Depletion mode transistors Q2 and Q4 and enhancement mode transistors Q5 and Q6 all overlap in the x-direction. As can be seen in FIG. 4B (and many of the other figures herein), the depletion mode transistors may be wider than the enhancement mode devices and may also often be shorter than the enhancement mode devices. In other words, the depletion mode transistors may tend to be short and wide while the enhancement mode transistors may tend to be longer and skinnier. An enhancement mode transistor may tend to have a much lower current density that a depletion mode transistor having the same size (footprint). Thus, by making the depletion mode transistors shorter and wider than the enhancement mode transistors it may be possible to better match the current densities of the two types of transistors, as the enhancement and depletion mode transistors are interconnected and need appropriate current levels for driving each other.

The metallization for the gate electrodes of the enhancement mode transistors Q1, Q3, Q6 and Q5 may be part of a first metal layer. The first metal layer may comprise, for example, a patterned gold layer, although other metals such as, for example, copper could be used. The metallization for the gate electrodes of the depletion mode transistors Q2 and Q4 may likewise be formed in the first metal layer. The metallization for the source/drain electrodes of both the enhancement mode and depletion mode transistors Q1-Q6 may also be formed in the first metal layer. The power supply voltage line VDD, the ground voltage line GND and the word line WL may be formed in a second metal layer, as may some of the interconnections between the transistors Q1-Q6. The second metal layer may comprise, for example, a gold layer or a copper layer, and may be electrically insulated from the first metal layer by one or more dielectric layers. The bit line BL, complementary bit line BL' and additional of the interconnections between the transistors Q1-Q6 may be formed in a third metal layer. The third metal layer may comprise, for example, a gold layer or a copper layer, and may be electrically insulated from the first and second metal layers by one or more dielectric layers. Conductive plugs 154 are provided that electrically connect elements in different of the metal layers.

As is further shown in FIG. 4B, in an example embodiment enhancement mode transistors Q1 and Q3 may have the same gate periphery, enhancement mode transistors Q5 and Q6 may have the same gate periphery, and depletion mode transistors Q2 and Q4 may have the same gate periphery. Herein, the "gate periphery" of a transistor refers to the width of the portion of the gate electrode of the transistor that extends in between the first and second source/drain electrodes of the transistor (i.e., the distance that the gate electrode extends between the source and drain electrodes). The gate peripheries of enhancement mode transistors Q1 and Q3 may be larger than the gate peripheries of enhancement mode transistors Q5 and Q6. For example, the gate peripheries of enhancement mode transistors Q1 and Q3 may be between 1.5 and 3.0 times larger than the gate peripheries of enhancement mode transistors Q5 and Q6. The gate electrodes of depletion mode transistors Q2 and Q4 may extend substantially parallel to the bit line BL and the complementary bit line BL', while the gate electrodes of enhancement mode transistors Q1, Q3, Q5 and Q6 may extend substantially perpendicular to the bit line BL and the complementary bit line BL'.

The SRAM circuit includes a multi-bit addressing circuit that comprises a plurality of depletion mode RF transistors and a plurality of enhancement mode RF transistors that are formed in the Group III nitride-based channel and barrier layers. The multi-bit addressing circuit includes the column control circuitry 162 and the row control circuitry 164 that are shown in FIG. 2A. The data input circuitry 166 and the data output circuitry 168 shown in FIG. 2A may be integrated with the column control circuitry 162 and connected to each column of SRAM cells 152.

Figure 5:
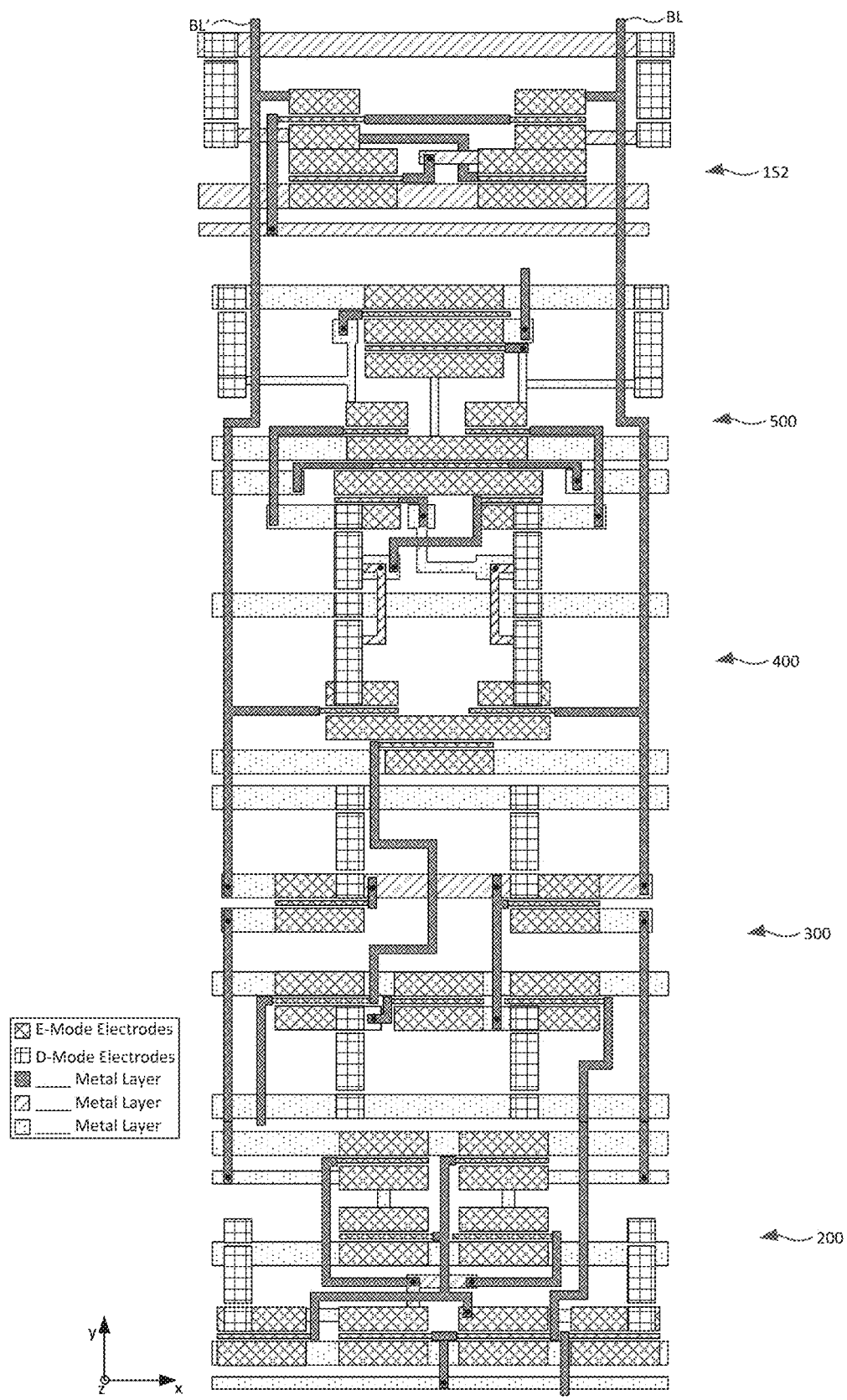
FIG. 5 is an enlarged plan view of the control circuitry for one of the columns of the SRAM memory block included in the Group III nitride-based semiconductor device of FIGS. 2A-2C.

FIG. 5 is an enlarged plan view of the circuitry connected to one of the columns of the SRAM block 150 included in the SRAM circuit 140 of FIGS. 2A-2C. FIG. 5B illustrates one of the sixteen SRAM cells 152 that would be included in the column (the other fifteen SRAM cells 152 would be stacked above the SRAM cell 152 shown at the top of FIG. 5). This circuitry corresponds to the column control circuit 162, the data input circuit 166 and the data output circuit 168 shown in FIG. 2A. As shown in FIG. 5, the circuitry connected to each column of cells 152 in the SRAM block comprises an input buffer circuit 200, a column enable circuit 300, a sense amplifier 400, and a sense amplifier buffer circuit 500. The first sense amplifier buffer circuit 500 is directly adjacent the column of SRAM cells 152. The column enable circuit 300 and the sense amplifier 400 are positioned between the sense amplifier buffer circuit 500 and the input buffer circuit 200. FIG. 5 depicts one specific layout for these circuits (and the components thereof) that may have a small footprint. The layout could be modified to rearrange the positions of the circuits and/or the components thereof while still achieving the same functionality. It will be appreciated that the present invention is not limited to the specific layout depicted in FIG. 5.

The input buffer circuit 200, the column enable circuit 300, the sense amplifier 400, and the sense amplifier buffer circuit 500 are each coupled to a bit line pair that includes a bit line BL and a complementary bit line BL', and hence are each associated with the bit line pair. The bit line pair may be coupled to each of the SRAM cells 152 in the column. One of the SRAM cells 152 is shown in FIG. 5 to provide context. The remaining fifteen SRAM cells 152 in the column would be stacked above the depicted SRAM cell 152. The various circuit elements in FIG. 5 are not individually labelled, as FIGS. 4B, 6B, 7B, 8B and 9B provide enlarged views of each of the individual circuits. Thus, the circuit elements of FIG. 5 will not be discussed here and will instead be discussed below with reference to the enlarged figures of each individual circuit.

Figure 6A:
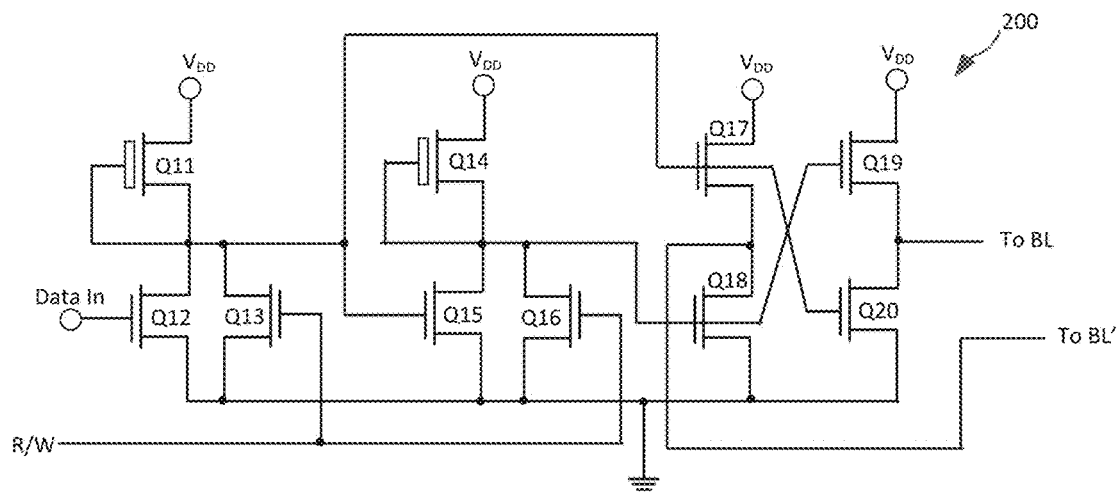
FIG. 6A is a circuit diagram of the input buffer included in the control circuitry of FIG. 5.

FIG. 6A is a circuit diagram of the input buffer circuit 200 included in the circuitry of FIG. 5. As shown in FIG. 6A, the input buffer circuit 200 includes transistors Q11-Q20. Transistors Q11 and Q14 are implemented as depletion mode transistors while transistors Q12-Q13 and Q15-Q20 are implemented as enhancement mode transistors.

As shown in FIG. 6A, a first source/drain electrode of depletion mode transistor Q11 is coupled to the power supply voltage $V_{DD}$, while the gate electrode and the second source/drain electrode of depletion mode transistor Q11 are commonly coupled to a first source/drain electrode of enhancement mode transistor Q12, to a first source/drain electrode of enhancement mode transistor Q13, and to the gate electrodes of enhancement mode transistors Q15, Q17 and Q20. The gate electrode of enhancement mode transistor Q12 is coupled to a data input line DATA IN, and the second source/drain electrode of enhancement mode transistor Q12 is coupled to ground. The gate electrode of enhancement mode transistor Q13 is coupled to a read/write line R/W that provides control signals to the SRAM circuit 140 that are used during read and write operations, and the second source/drain electrode of enhancement mode transistor Q13 is coupled to ground.

The first source/drain electrode of depletion mode transistor Q14 is coupled to the power supply voltage $V_{DD}$, while the gate electrode and the second source/drain electrode of depletion mode transistor Q14 are commonly coupled to a first source/drain electrode of enhancement mode transistor Q15, to a first source/drain electrode of enhancement mode transistor Q16, and to the gate electrodes of enhancement mode transistors Q18 and Q19. The second source/drain electrode of enhancement mode transistor Q15 and the second source/drain electrode of enhancement mode transistor Q16 are each coupled to ground, and the gate electrode of enhancement mode transistor Q16 is coupled to the read/write line R/W. The first source/drain electrode of enhancement mode transistor Q17 is coupled to the power supply voltage $V_{DD}$, while the second source/drain electrode of enhancement mode transistor Q17 and the first source/drain electrode of enhancement mode transistor Q18 are both coupled to the complementary bit line BL'. The second source/drain electrode of enhancement mode transistor Q18 is coupled to ground. The first source/drain electrode of enhancement mode transistor Q19 is coupled to the power supply voltage $V_{DD}$, while the second source/drain electrode of enhancement mode transistor Q19 and the first source/drain electrode of enhancement mode transistor Q20 are both coupled to the bit line BL. The second source/drain electrode of enhancement mode transistor Q20 is coupled to ground.

Figure 6B:
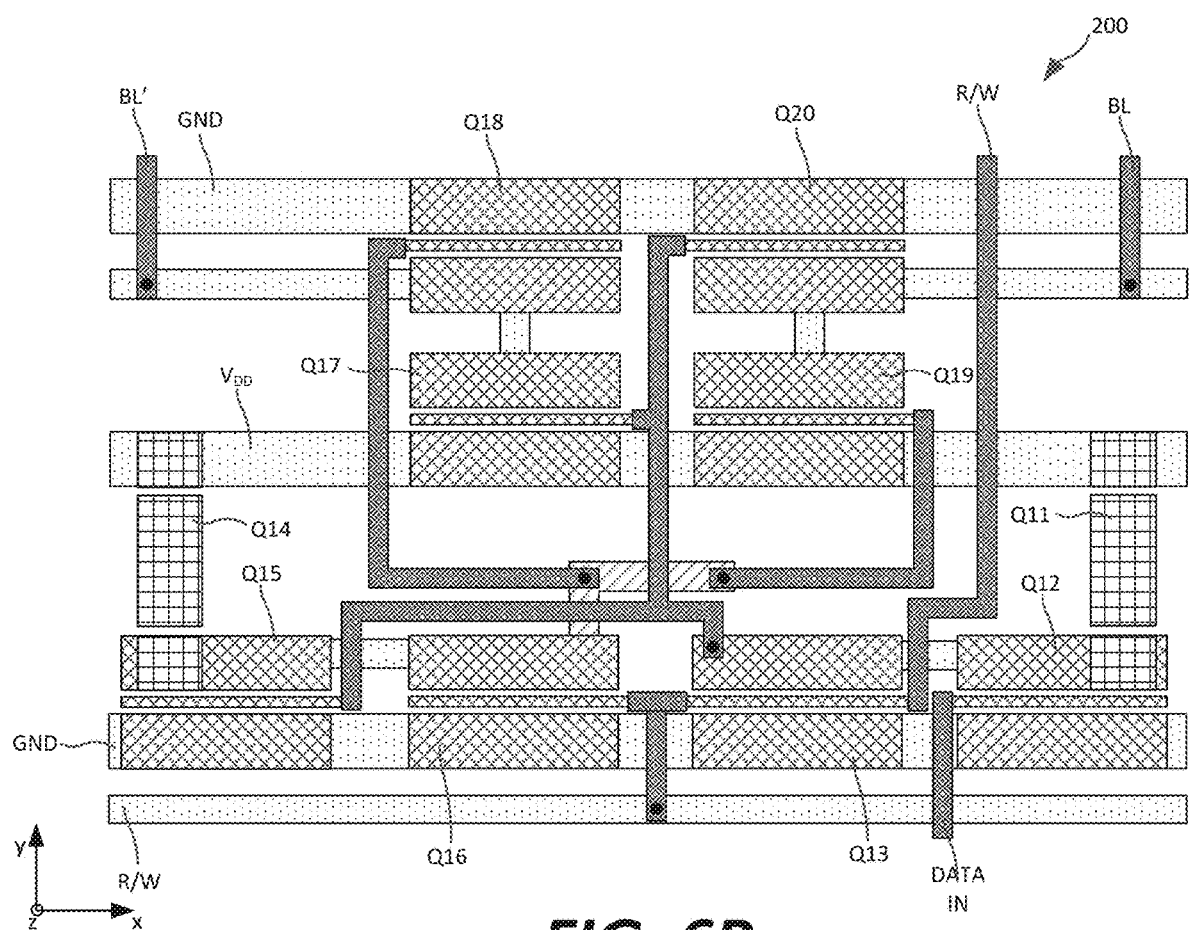
FIG. 6B is a greatly enlarged plan view of the input buffer circuit of FIG. 5.

FIG. 6B is an enlarged plan view of an example implementation of the input buffer circuit 200 of FIG. 5 that has the circuit diagram of FIG. 6A. As shown in FIG. 6B, the input buffer circuit 200 includes transistors Q11-Q20 that are formed in the semiconductor die 110. Enhancement mode transistors Q12-Q13 and Q15-Q16 may all overlap in the x-direction, and may be aligned in the x-direction. Herein, two transistors are aligned if gate electrodes of the two transistors are colinear. Enhancement mode transistors Q16-Q18 may overlap in the y-direction, and may be aligned in the y-direction. Enhancement mode transistors Q13 and Q19-Q20 may similarly overlap in the y-direction, and may be aligned in the y-direction. Enhancement mode transistors Q18 and Q10 may overlap in the x-direction, and may be aligned in the x-direction, and enhancement mode transistors Q17 and Q19 may similarly overlap in the x-direction and may be aligned in the x-direction. Depletion mode transistor Q14 may overlap enhancement mode transistor Q15 in the y-direction, and depletion mode transistor Q11 may overlap enhancement mode transistor Q12 in the y-direction. Depletion mode transistor Q14 may overlap depletion mode transistor Q11 in the x-direction. Enhancement mode transistors Q18 and Q20 may be positioned between the bit line BL and the complementary bit line BL'. Enhancement mode transistors Q17-Q20 may define a second rectangle.

The gate electrodes of enhancement mode transistors Q12-Q13 and Q15-Q16 may be colinear and may extend in the x-direction. The gate electrodes of enhancement mode transistors Q17 and Q19 may be colinear and may extend in the x-direction, and the gate electrodes of enhancement mode transistors Q18 and Q20 may also be colinear and may extend in the x-direction. Enhancement mode transistors Q12-Q13 and Q15-Q16 may each have substantially the same gate periphery. Likewise, enhancement mode transistors Q17-Q20 may have substantially the same gate periphery. In some embodiments, enhancement mode transistors Q12-Q13 and Q15-Q20 may all have substantially the same gate periphery. The gate electrodes of depletion mode transistors Q11 and Q14 may extend in the y-direction, while the gate electrodes of enhancement mode transistors Q12-Q13 and Q15-Q20 may extend in the x-direction so that the gate electrodes of depletion mode transistors Q11 and Q14 extend substantially perpendicular to the gate electrodes of enhancement mode transistors Q12-Q13 and Q15-Q20. Enhancement mode transistors Q17-Q20 may be positioned between one axis defined by a longitudinal axis of depletion mode transistor Q11 and another axis defined by a longitudinal axis of depletion mode transistor Q14. The interconnections between transistors Q11-Q20 may be in the above-referenced second and/or third metal layers.

Figure 7A:
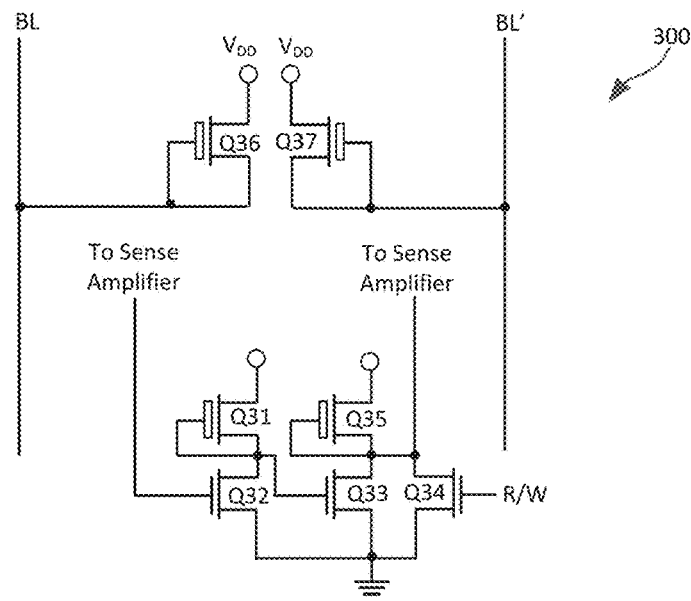
FIG. 7A is a circuit diagram of the column enable circuit included in the control circuitry of FIG. 5.

FIG. 7A is a circuit diagram of the column enable circuit 300 included in the circuitry of FIG. 5. As shown in FIG. 7A, the column enable circuit 300 includes transistors Q31-Q37. Transistors Q31 and Q35-Q37 are implemented as depletion mode transistors while transistors Q32-Q34 are implemented as enhancement mode transistors.

As shown in FIG. 7A, a first source/drain electrode of depletion mode transistor Q31 is coupled to the power supply voltage $V_{DD}$, while the gate electrode and the second source/drain electrode of depletion mode transistor Q31 are commonly coupled to a first source/drain electrode of enhancement mode transistor Q32 and to the gate electrode of enhancement mode transistor Q33. The gate electrode of enhancement mode transistor Q32 is coupled to the sense amplifier (discussed below with reference to FIGS. 8A-8B), and the second source/drain electrode of enhancement mode transistor Q32 is coupled to ground. The first source/drain electrode of depletion mode transistor Q35 is coupled to the power supply voltage $V_{DD}$, while the gate electrode and the second source/drain electrode of depletion mode transistor Q35 are commonly coupled to a first source/drain electrode of enhancement mode transistor Q33, to the first source/drain electrode of enhancement mode transistor Q34, and to a node of the sense amplifier 400. The second source/drain electrode of enhancement mode transistor Q33 and the second source/drain electrode of enhancement mode transistor Q34 are each coupled to ground. The gate electrode of enhancement mode transistor Q34 is coupled to the read/write line R/W. The first source/drain electrode of depletion mode transistor Q36 and the first source/drain electrode of depletion mode transistor Q37 are each coupled to the power supply voltage $V_{DD}$. The gate electrode and the second source/drain electrode of depletion mode transistor Q36 are commonly coupled to the bit line BL, while the gate electrode and the second source/drain electrode of depletion mode transistor Q37 are commonly coupled to the complementary bit line BL'.

Figure 7B:
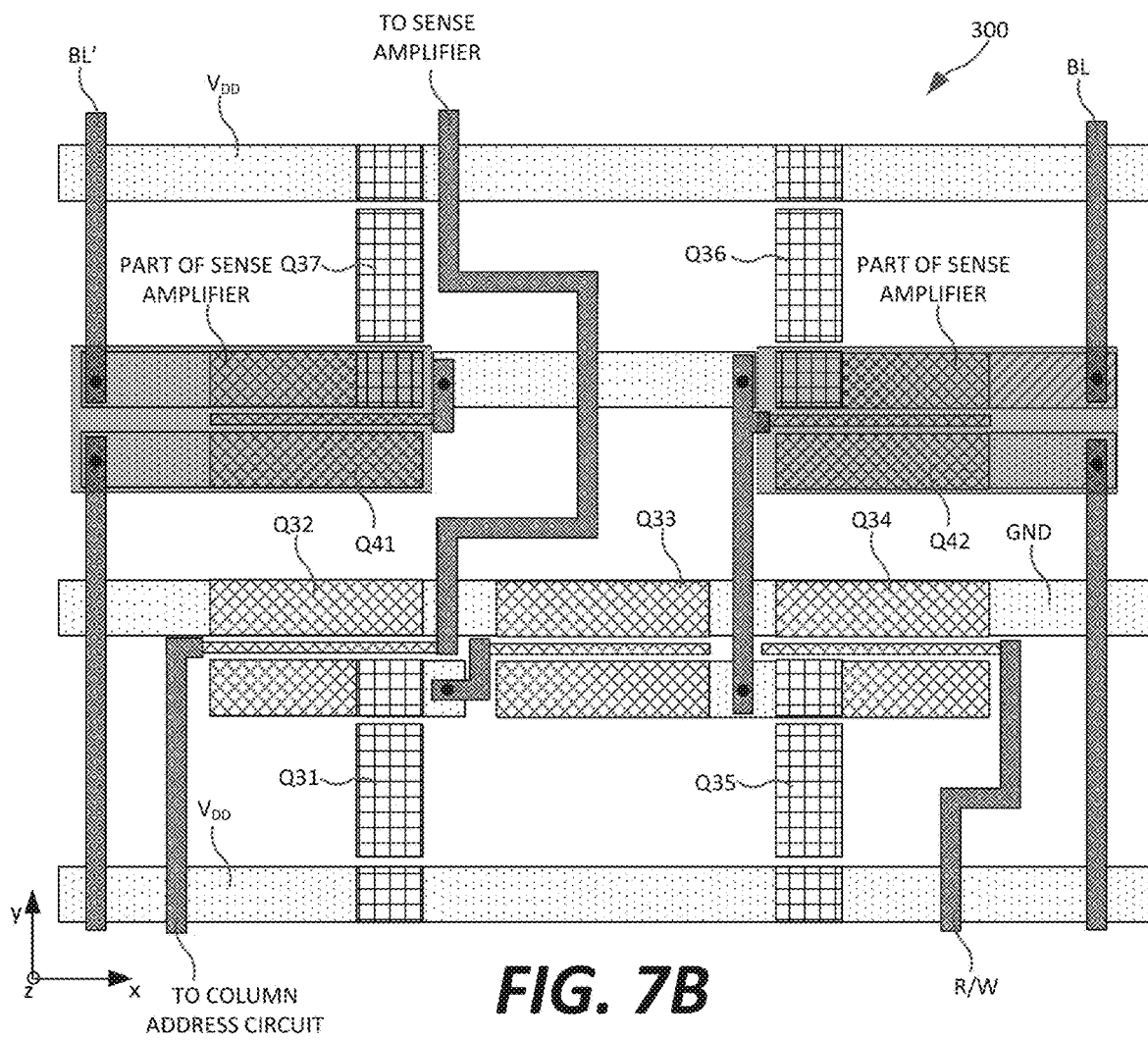
FIG. 7B is a greatly enlarged plan view of the column enable circuit of FIG. 5.

FIG. 7B is a greatly enlarged plan view of an example implementation of the column enable circuit 300 of FIG. 5 that has the circuit diagram of FIG. 7A. As shown in FIG. 7B, enhancement mode transistors Q32-Q34 may each have approximately the same gate periphery, and depletion mode transistors Q31 and Q35-Q37 may each have approximately the same gate periphery. Enhancement mode transistors Q32-Q34 may all overlap in the x-direction. Gate electrodes of enhancement mode transistors Q32-Q34 may be aligned along an axis (i.e., may be colinear). Depletion mode transistors Q31 and Q35 may be on one side of this axis and depletion mode transistors Q36 and Q37 may be on an opposed side of this axis. Depletion mode transistors Q31 and Q37 may overlap in the y-direction, and depletion mode transistors Q35 and Q36 may similarly overlap in the y-direction. Enhancement mode transistor Q41, which is part of the sense amplifier 400, is positioned between enhancement mode transistor Q32 and depletion mode transistor Q37 in the y-direction, and enhancement mode transistor Q42, which is also part of the sense amplifier 400, is positioned between enhancement mode transistor Q34 and depletion mode transistor Q36 in the y-direction. Enhancement mode transistors Q41 and Q42 are discussed in greater detail below with reference to FIGS. 8A-8B. All of transistors Q31-Q37 may be positioned between the bit line BL and the complementary bit line BL'. The gate electrodes of enhancement mode transistors Q32-Q34 may be colinear and may extend in the x-direction.

As noted above, enhancement mode transistors Q41 and Q42, which are part of the sense amplifier 400, are disposed within the footprint of the column enable circuit. Thus, a first portion of the column enable circuit 300 that includes transistors Q31-Q35 is positioned in between the input buffer circuit 200 (FIG. 6B) and the sense amplifier 400 (FIG. 8B). A second portion of the column enable circuit that includes transistors Q36-Q37 is positioned within a footprint of the sense amplifier 400. Herein, the footprint of the circuit refers to the smallest rectangle that can be drawn around the entirety of the circuit when the circuit is viewed from above.

The interconnections between transistors Q31-Q37 may be in the above-referenced second and third metal layers in some embodiments. The gate electrodes of enhancement mode transistors Q32-Q34 may extend in the x-direction, while the gate electrodes of depletion mode transistors Q31 and Q35-Q37 may extend in the y-direction so that the gate electrodes of enhancement mode transistors Q32-Q34 extend substantially perpendicular to the gate electrodes of depletion mode transistors Q31 and Q35-Q37.

Referring to FIGS. 5, 6B and 7B, it can be seen that enhancement mode transistors Q17-Q20 are positioned between the enhancement mode transistors (Q12-Q13, Q15-Q16) and the first column enable circuit 300. Referring to FIGS. 5, 7B and 8B, it can be seen that at least part of enhancement mode transistor Q41 of sense amplifier 400 is positioned between the axis defined by the gate electrodes of enhancement mode transistors Q32-Q34 and depletion mode transistor Q37 of column enable circuit 300, and at least part of enhancement mode transistor Q42 of sense amplifier 400 is similarly positioned between this axis and depletion mode transistor Q36 of column enable circuit 300. Depletion mode transistors Q36 and Q37 are positioned between an axis defined by the gate electrodes of enhancement mode transistors Q41 and Q42 and an axis defined by a longitudinal axis of enhancement mode transistor Q43.

Figure 8A:
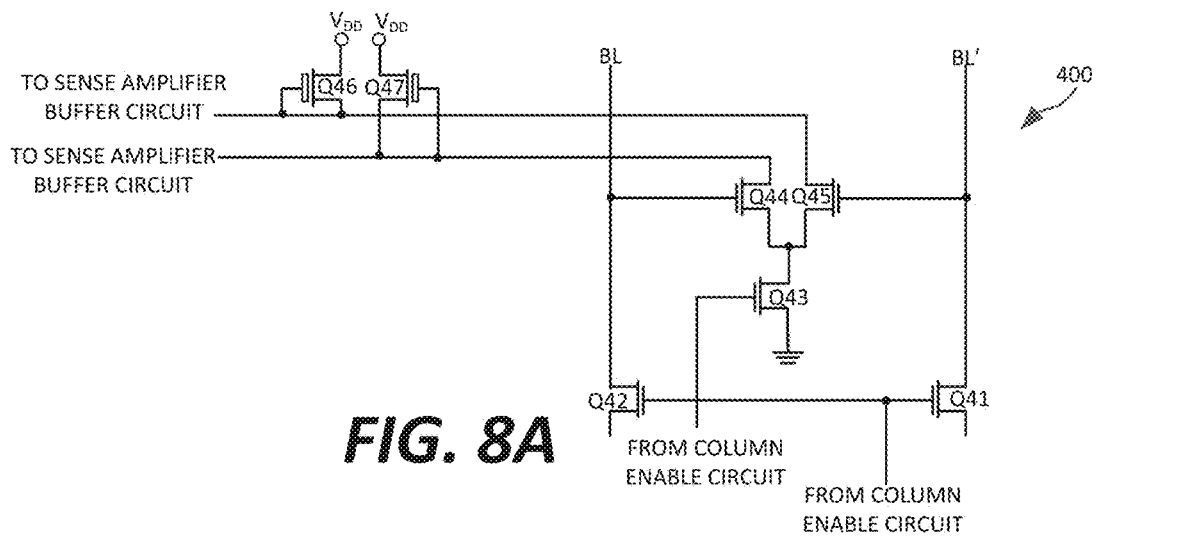
FIG. 8A is a circuit diagram of the sense amplifier included in the control circuitry of FIG. 5.
Figure 8B:
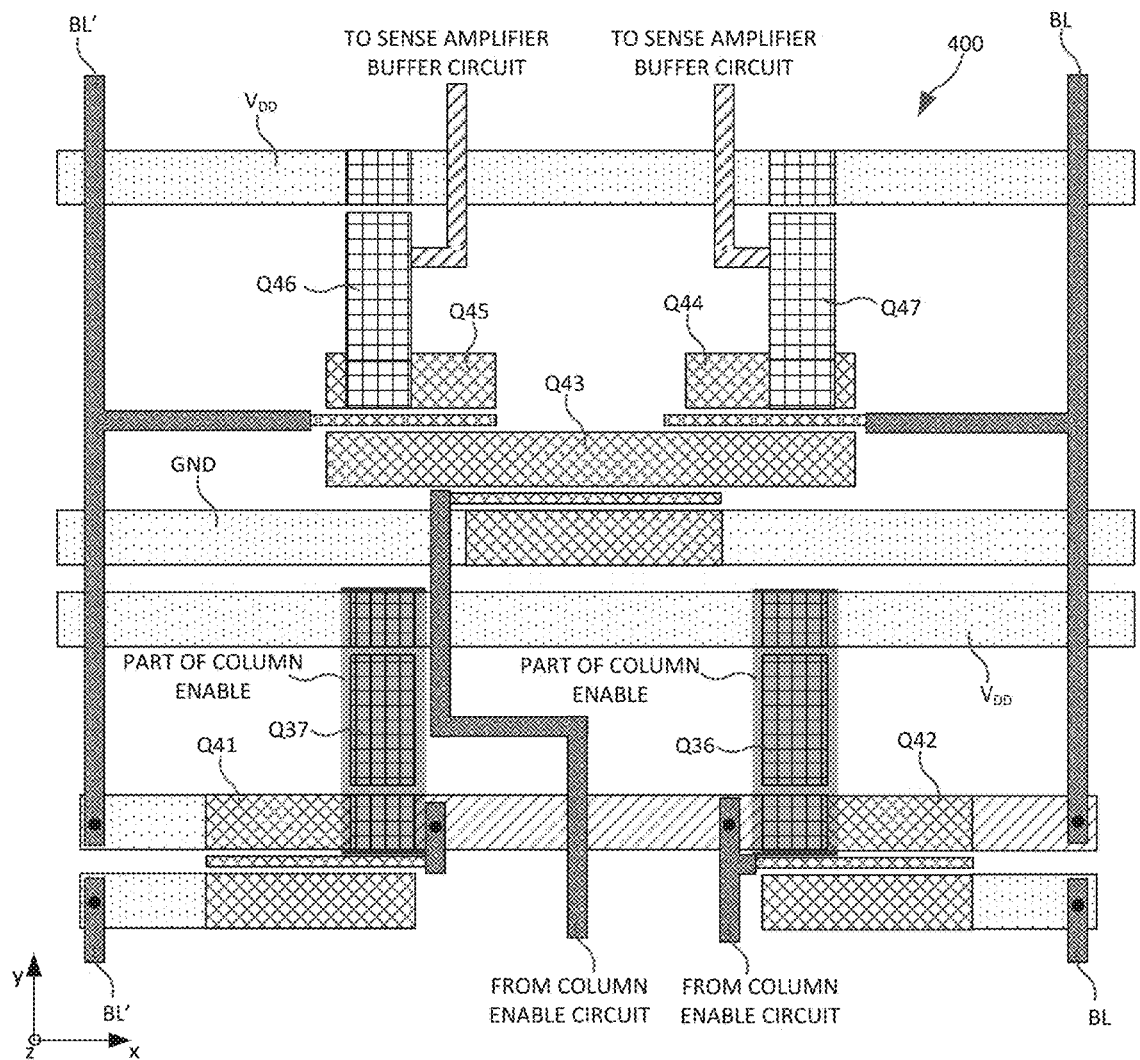
FIG. 8B is a greatly enlarged plan view of the sense amplifier of FIG. 5.

FIG. 8A is a circuit diagram of the sense amplifier 400 included in the circuitry of FIG. 5. As shown in FIG. 8A, the sense amplifier 400 includes transistors Q41-Q47. Transistors Q46-Q47 are implemented as depletion mode transistors while transistors Q41-Q45 are implemented as enhancement mode transistors.

As shown in FIG. 8A, enhancement mode transistor Q42 is electrically coupled in series along the bit line BL, and enhancement mode transistor Q41 is electrically coupled in series along the complementary bit line BL'. The gate electrodes of enhancement mode transistor Q41 and Q42 are coupled together and coupled to a node of the column enable circuit 300. The first source/drain electrode of depletion transistor Q46 is coupled to the power supply voltage $V_{DD}$, while the gate electrode and the second source/drain electrode of depletion mode transistor Q46 are commonly coupled to the first source/drain electrode of enhancement mode transistor Q45 and to a node of the sense amplifier buffer circuit 500 (discussed below with reference to FIGS. 9A-9B). The first source/drain electrode of depletion mode transistor Q47 is also coupled to the power supply voltage $V_{DD}$, while the gate electrode and the second source/drain electrode of depletion mode transistor Q47 are commonly coupled the first source/drain electrode of enhancement mode transistor Q44 and to node of the sense amplifier buffer circuit 500. The second source/drain electrode of enhancement mode transistor Q44 and the second source/drain electrode of enhancement mode transistor Q45 are coupled together and to the first source/drain electrode of enhancement mode transistor Q43. The gate electrode of enhancement mode transistor Q43 is coupled to the gate electrode of enhancement mode transistor Q34 of column enable circuit 300. The second source/drain electrode of enhancement mode transistor Q43 is coupled to ground. The gate electrode of enhancement mode transistor Q45 is coupled to the complementary bit line BL', and the gate electrode of enhancement mode transistor Q44 is coupled to the bit line BL.

FIG. 8B is an enlarged plan view of the sense amplifier 400 of FIG. 5 that has the circuit diagram of FIG. 8A. As shown in FIG. 8B, enhancement mode transistors Q41 and Q42 may have approximately the same gate periphery and may overlap in the x-direction. Likewise, enhancement mode transistors Q44 and Q45 may have approximately the same gate periphery and may overlap in the x-direction. The gate periphery of each of enhancement mode transistors Q44 and Q45 may be smaller than the gate peripheries of each of enhancement mode transistors Q41 and Q42. Enhancement mode transistor Q43 may have a larger gate periphery than any of enhancement mode transistors Q41-Q42 and Q44-Q45. The first source/drain electrode of enhancement mode transistor Q43 may be longer than the second source/drain electrode of enhancement mode transistor Q43. This allows the first source/drain electrode of enhancement mode transistor Q43 to also act as the second source/drain electrode of both enhancement mode transistors Q44 and Q45. Transistors Q41-Q47 may all be positioned between the bit line BL and the complementary bit line BL'.

The gate electrodes of enhancement mode transistors Q41 and Q42 may be colinear and may extend in the x-direction. The gate electrodes of enhancement mode transistors Q44 and Q45 may be colinear and may extend in the x-direction. The gate electrode of enhancement mode transistor Q43 may also extend in the x-direction. In some embodiments, enhancement mode transistors Q41 and Q42 may have substantially the same gate periphery, and enhancement mode transistors Q44 and Q45 may have substantially the same gate periphery. The gate electrodes of depletion mode transistors Q46 and Q47 may each have substantially the same gate periphery. The gate electrode of depletion mode transistors Q46 and Q47 may extend in the y-direction so that the gate electrodes of enhancement mode transistors Q41-Q45 extend substantially perpendicular to the gate electrodes of depletion mode transistors Q46-Q47. The interconnections between transistors Q41-Q47 may be in the second and third metal layers in example embodiments.

Figure 9A:
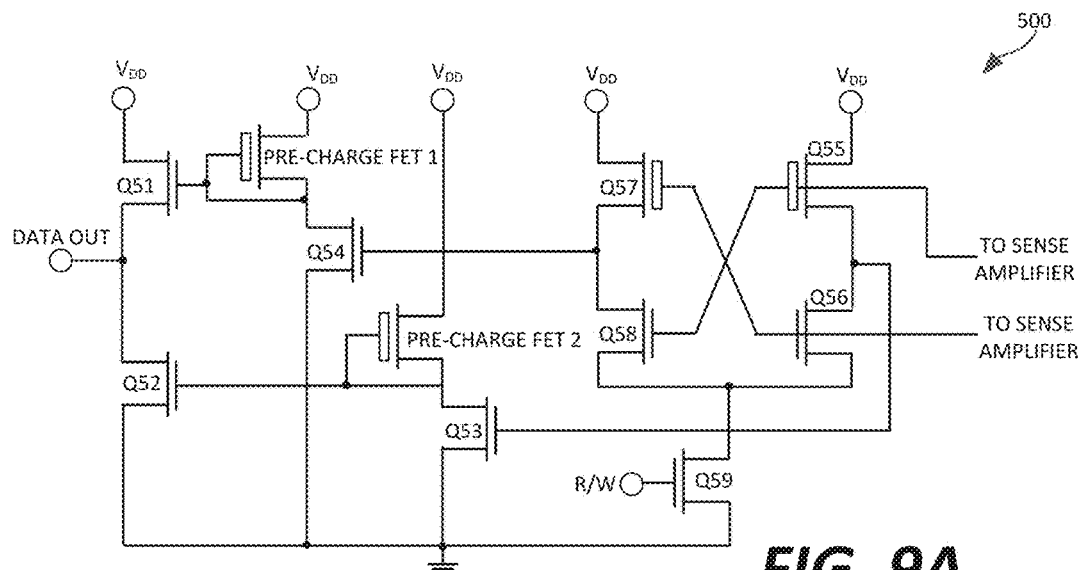
FIG. 9A is a circuit diagram of the sense amplifier buffer circuit included in the control circuitry of FIG. 5.

FIG. 9A is a circuit diagram of the sense amplifier buffer circuit 500 included in the control circuitry of FIG. 5. As shown in FIG. 9A, the sense amplifier buffer circuit 500 includes transistors Q51-Q59, as well as a pair of pre-charge depletion mode transistors ("PRE-CHARGE FET"). Transistors Q51-Q54, Q56 and Q58-Q59 are implemented as enhancement mode transistors while transistors Q55 and Q57 and the two pre-charge transistors are implemented as depletion mode transistors.

As shown in FIG. 9A, the first source/drain electrode of enhancement mode transistor Q51 is coupled to the power supply voltage $V_{DD}$, while the second source/drain electrode of enhancement mode transistor Q51 is coupled to a data output node DATA OUT, which is a node where data that is read from a column of memory cells 152 of the SRAM block 150 is output. The first source/drain electrode of enhancement mode transistor Q52 is also coupled to the data output node DATA OUT, and the second source/drain electrode of enhancement mode transistor Q52 is coupled to ground. The gate electrode of enhancement mode transistor Q51 is coupled to the gate and second source/drain electrode of the first pre-charge FET and to a first source/drain electrode of enhancement mode transistor Q54. The first source/drain electrode of the first pre-charge FET is coupled to the power supply voltage $V_{DD}$. The gate electrode of enhancement mode transistor Q52 is coupled to the gate and second source/drain electrode of the second pre-charge FET and to a first source/drain electrode of enhancement mode transistor Q53. A second source/drain electrode of enhancement mode transistor Q53 is coupled to ground. A first source/drain electrode of the second pre-charge FET is coupled to the power supply voltage $V_{DD}$. The gate electrode of enhancement mode transistor Q54 is coupled to a second source/drain electrode of depletion mode transistor Q57 and to a first source/drain electrode of enhancement mode transistor Q58. A second source/drain electrode of enhancement mode transistor Q54 is coupled to ground.

A gate electrode of enhancement mode transistor Q53 is coupled to a second source/drain electrode of depletion mode transistor Q55 and to a first source/drain electrode of enhancement mode transistor Q56.

A first source/drain electrode of depletion mode transistor Q55 is coupled to the power supply voltage $V_{DD}$, as is a first source/drain electrode of depletion mode transistor Q57. The gate electrode of depletion mode transistor Q55 is coupled to the gate electrode of enhancement mode transistor Q58 and to a node of the sense amplifier 400. The gate electrode of depletion mode transistor Q57 is coupled to the gate electrode of enhancement mode transistor Q56 and to another node of the sense amplifier 400. The second source/drain electrodes of enhancement mode transistors Q56 and Q58 are commonly coupled to the first source/electrode of enhancement mode transistor Q59. The gate electrode of enhancement mode transistor Q59 is coupled to the read/write line R/W and the second source/drain electrode of enhancement mode transistor Q59 is coupled to ground.

Figure 9B:
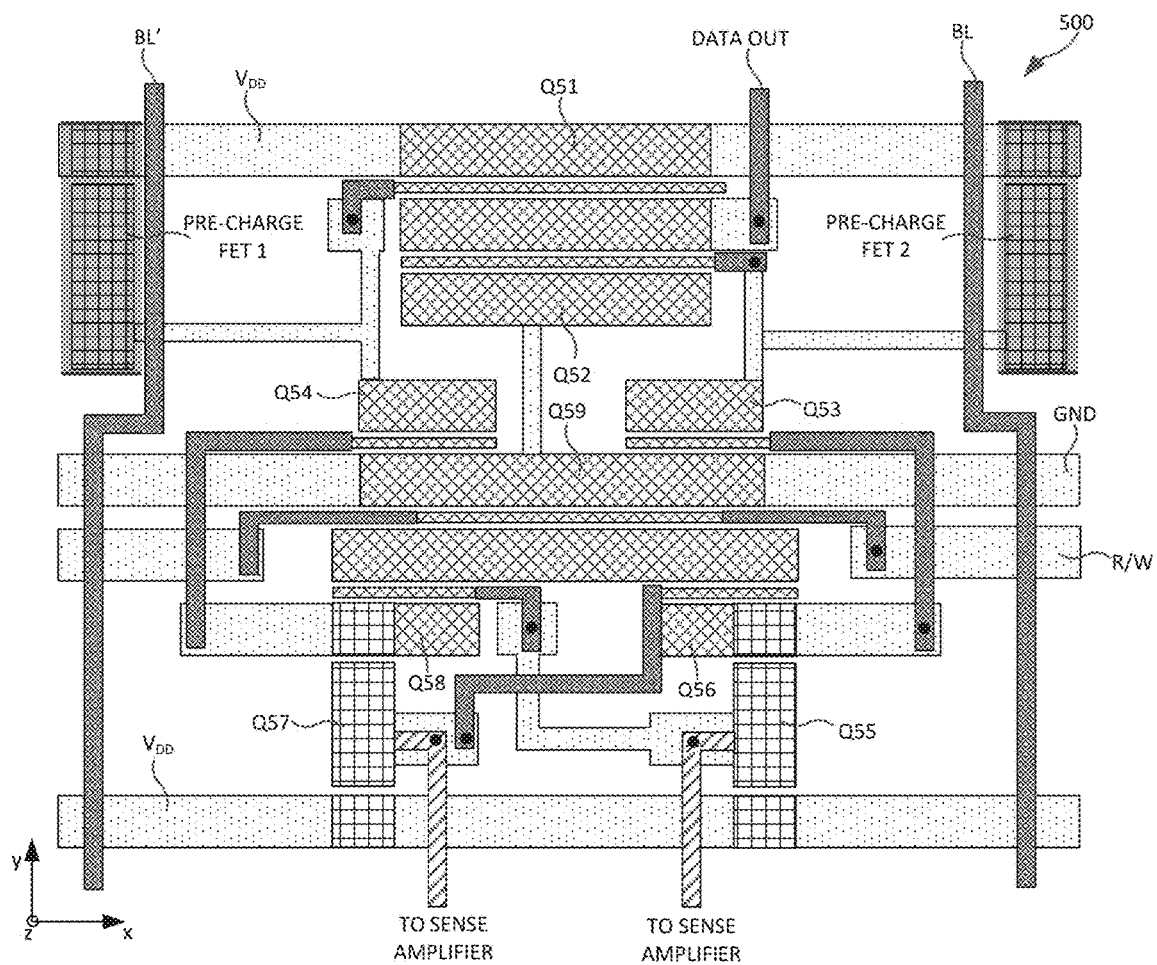
FIG. 9B is a greatly enlarged plan view of the sense amplifier buffer circuit of FIG. 5.

FIG. 9B is an enlarged plan view of the sense amplifier buffer circuit 500 of FIG. 5 that has the circuit diagram of FIG. 9A. As shown in FIG. 9B, enhancement mode transistors Q51 and Q52 may have approximately the same gate periphery and may overlap in the y-direction. Enhancement mode transistors Q53 and Q54 may have approximately the same gate periphery and may overlap in the x-direction, and enhancement mode transistors Q56 and Q58 may also have approximately the same gate periphery and may overlap in the x-direction. Enhancement mode transistors Q53-Q54, Q56 and Q58 may all have approximately the same gate periphery. The gate periphery of each of enhancement mode transistors Q53-Q54, Q56 and Q58 may be smaller than the gate peripheries of each of enhancement mode transistors Q51 and Q52. Enhancement mode transistor Q59 may have a larger gate periphery than any of enhancement mode transistors Q51-Q54, Q56 and Q58. The first source/drain electrode of enhancement mode transistor Q59 may be longer than the second source/drain electrode of enhancement mode transistor Q59. This allows the first source/drain electrode of enhancement mode transistor Q59 to also act as the second source/drain electrode of enhancement mode transistor Q56 and as the second source/drain electrode of enhancement mode transistor Q58. The second source/drain electrode of enhancement mode transistor Q59 may act as the second source/drain electrode of enhancement mode transistor Q53 and as the second source/drain electrode of enhancement mode transistor Q54. Enhancement mode transistor Q59 may overlap transistors Q51-Q58 in the y-direction. Transistors Q51-Q54, Q56 and Q58 may all be positioned between the bit line BL and the complementary bit line BL'.

The gate electrodes of enhancement mode transistors Q56 and Q58 may be colinear and may extend in the x-direction. The gate electrodes of enhancement mode transistors Q53 and Q54 may be colinear and may extend in the x-direction. The gate electrodes of enhancement mode transistors Q51-Q52 and Q59 may also extend in the x-direction. Depletion mode transistors Q55 and Q57 may overlap in the x-direction. The gate electrodes of depletion mode transistors Q55 and Q57 may each have substantially the same gate periphery. The gate electrode of depletion mode transistors Q55 and Q57 may each extend in the y-direction so that the gate electrodes of enhancement mode transistors Q51-Q54, Q56 and Q58 extend substantially perpendicular to the gate electrodes of depletion mode transistors Q55 and Q57. The interconnections between transistors Q51-Q59 may be in the second and third metal layers in example embodiments. The first and second pre-charge FETs may be positioned outside the region between the bit line BL and the complementary bit line BL'. The first and second pre-charge FETs may overlap both enhancement mode transistor Q51 and enhancement mode transistor Q52 in the x-direction.

Figure 10A:
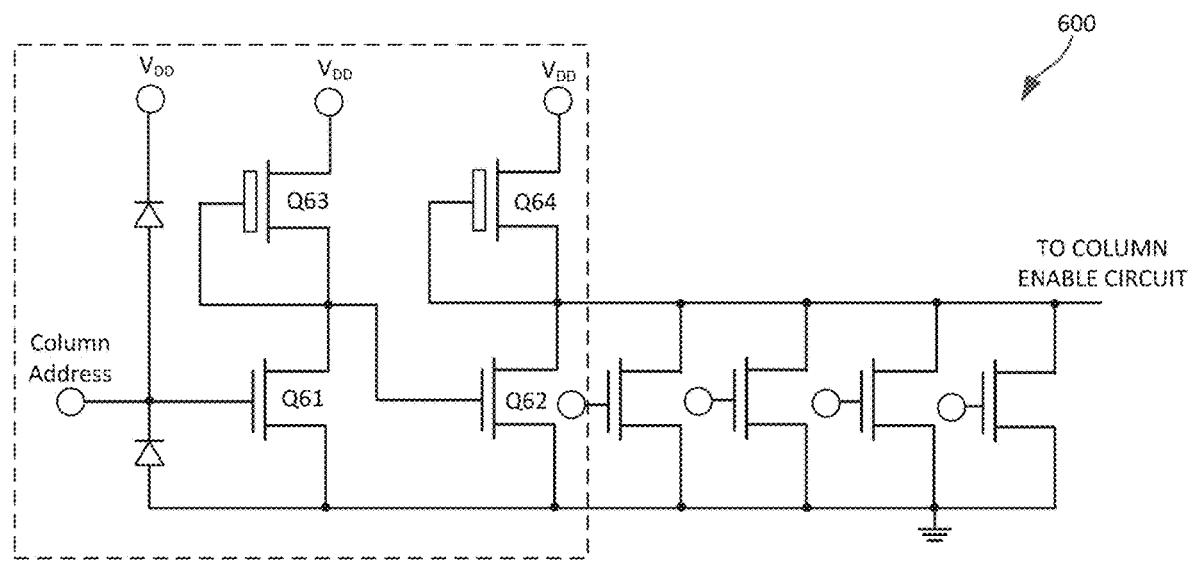
FIG. 10A is a simplified circuit diagram of the column address circuit included in the Group III nitride-based semiconductor device of FIGS. 2A-2C.

FIG. 10A is a circuit diagram of the column address circuit included in the Group III nitride-based semiconductor device of FIGS. 2A-2C. It will be appreciated that the column address circuit includes a plurality of sub-circuits, each of which is associated with a respective one of the columns of the SRAM block 150. The portion of FIG. 10A within the dashed box represents one of the sub-circuits, which is connected to the column enable circuit 300 associated with a first of the columns of the SRAM block 150. The remainder of the circuit illustrated in FIG. 10A is a schematic representation indicating that the sub-circuit is repeated for each of the remaining columns of the SRAM block 150.

As shown in FIG. 10A, each sub-circuit of the column address circuit includes two enhancement mode transistors Q61 and Q62, two depletion mode transistors Q63 and Q64, and two diodes D66 and D67. The first source/drain electrode of each depletion mode transistor Q63, Q64 is coupled to the power supply voltage $V_{DD}$. The gate electrode and the second source/drain electrode of depletion mode transistor Q63 are commonly coupled to a first source/drain electrode of enhancement mode transistor Q61 and to the gate electrode of enhancement mode transistor Q62. The gate electrode and the second source/drain electrode of depletion mode transistor Q64 are commonly coupled to a first source/drain electrode of enhancement mode transistor Q62 and to a node of the column enable circuit for one of the columns of SRAM block 150. The gate electrode of enhancement mode transistor Q61 is coupled to a column address input COLUMN ADDRESS. The diodes D66 and D67 provide electric static discharge protection. The second source/drain electrodes of enhancement mode transistors Q61 and Q62 are commonly coupled to ground.

Figure 10B:
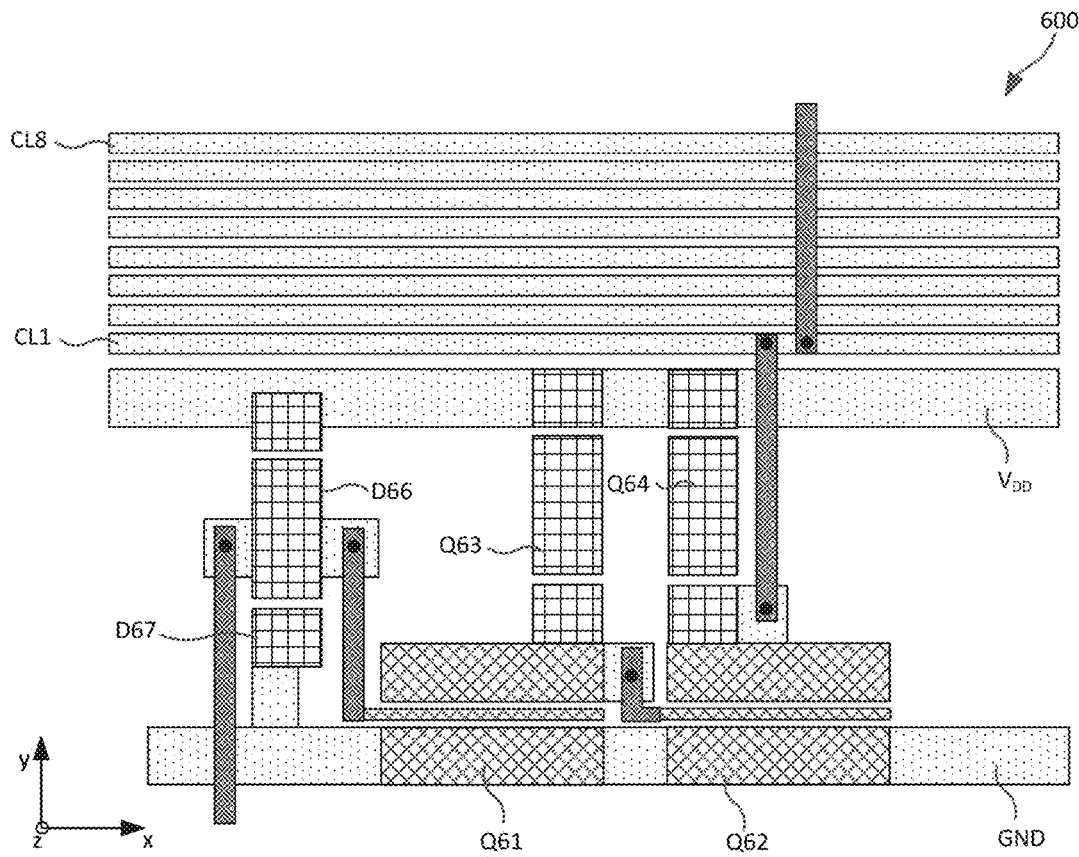
FIG. 10B is a plan view of a portion of an implementation of the column address circuit of FIGS. 2A-2C.

FIG. 10B is an enlarged plan view of the portion of column address circuit of FIG. 10A that is enclosed in the dashed box.

As shown in FIG. 10B, the gate electrodes of the enhancement mode transistors Q61, Q62 extend in the x-direction and are colinear with each other. Thus, enhancement mode transistors Q61 and Q62 overlap each other in the x-direction. Depletion mode transistor Q63 overlaps enhancement mode transistor Q61 in the y-direction, and depletion mode transistor Q64 overlaps enhancement mode transistor Q62 in the y-direction. Depletion mode transistor Q63 overlaps depletion mode transistor Q64 in the x-direction.

The metallization for the gate electrodes and the source/drain electrodes of transistors Q61-Q64 may be formed in the first metal layer. The power supply voltage line $V_{DD}$, the ground voltage line GND and the column enable lines CL may be formed in second metal layer, as may some of the interconnections between the transistors Q61-Q64.

As is further shown in FIG. 10B, in an example embodiment, enhancement mode transistors Q61 and Q62 may have the same gate periphery, and depletion mode transistors Q63-Q64 may have the same gate periphery. The gate electrodes of depletion mode transistors Q63-Q64 may extend substantially perpendicular to the gate electrodes of enhancement mode transistors Q61-Q62.

Figure 11A:
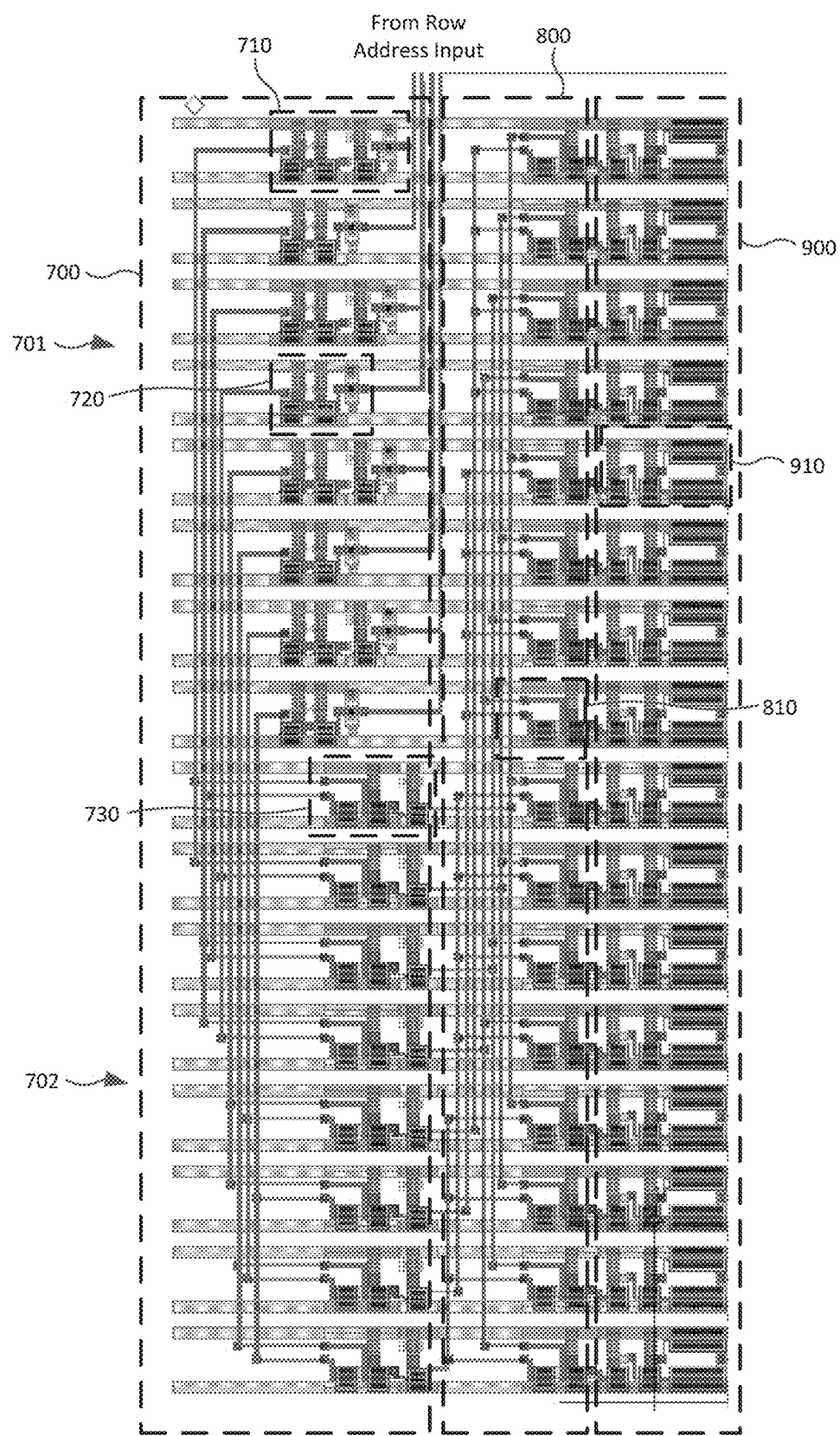
FIG. 11A is a plan view of an implementation of the row address circuitry included in the Group III nitride-based semiconductor device of FIGS. 2A-2C.
Figure 11B:
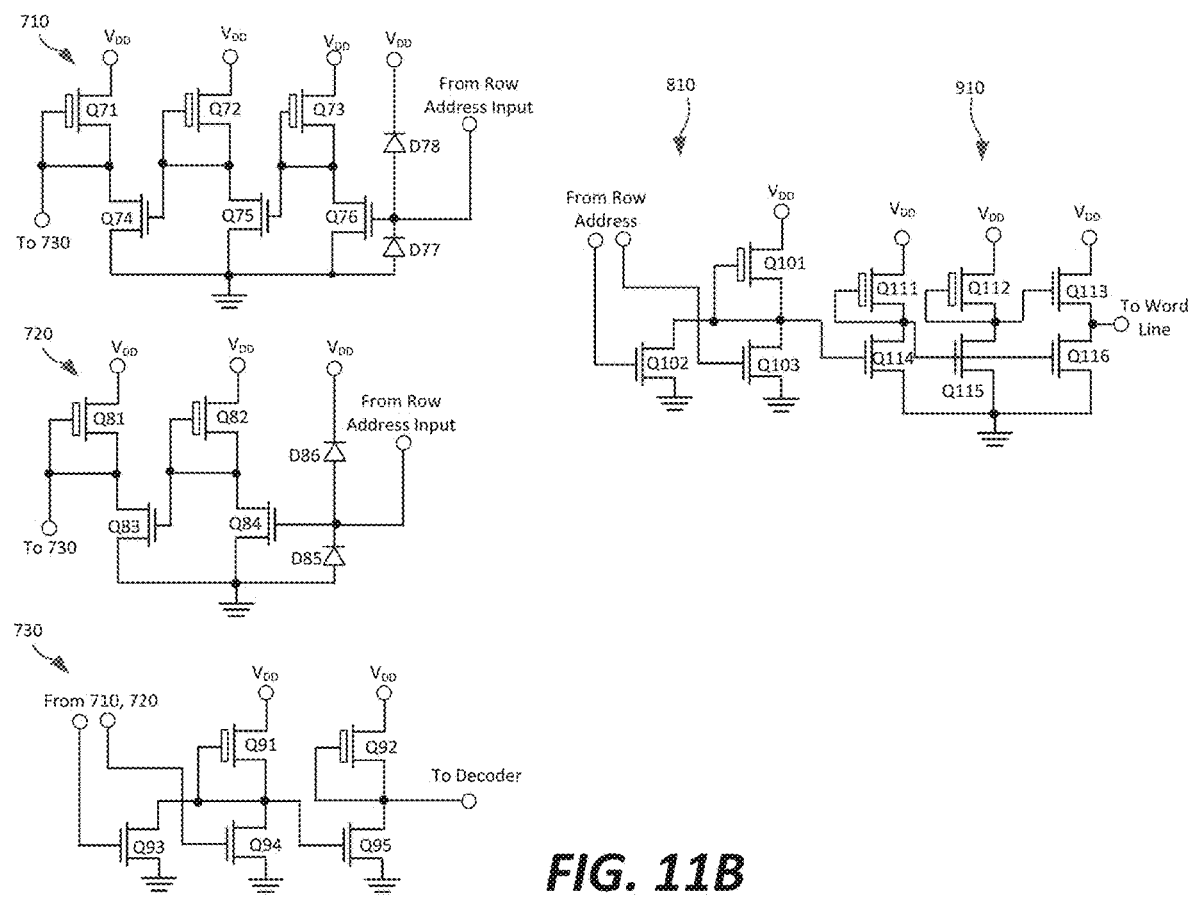
FIG. 11B is a circuit diagram of selected portions of the row address circuitry of FIG. 11A.
Figure 11C:
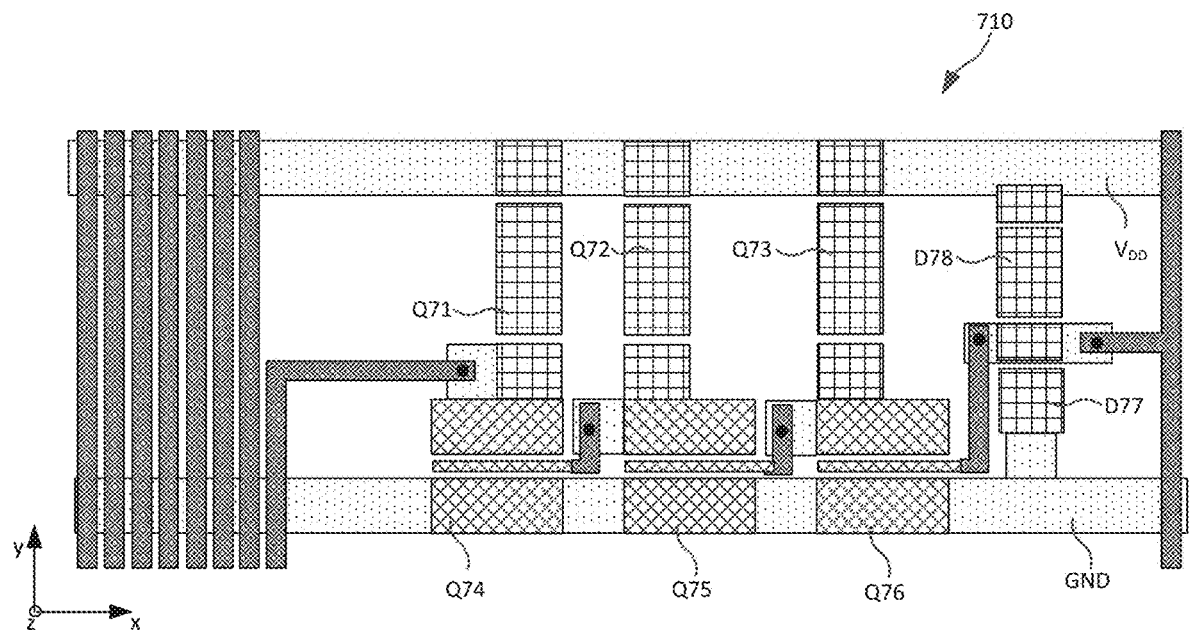
FIG. 11C is a greatly enlarged plan view of a first basic circuit element included in the implementation of the row address buffer circuit portion of the row address circuitry of FIG. 11A.
Figure 11D:
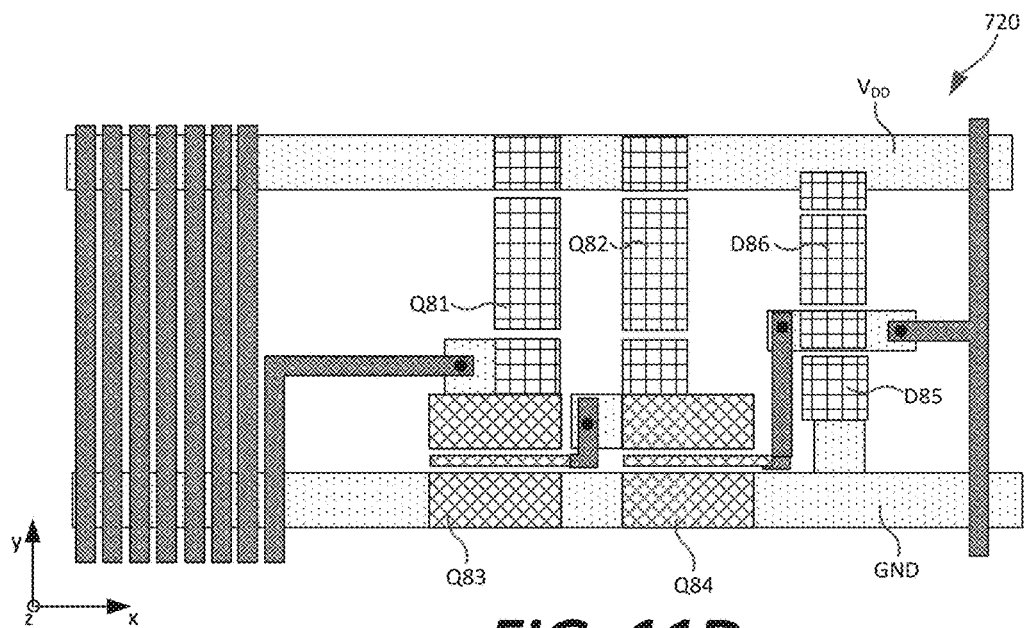
FIG. 11D is a greatly enlarged plan view of a second basic circuit element included in the implementation of the row address circuit portion of the row address circuitry of FIG. 11A.
Figure 11E:
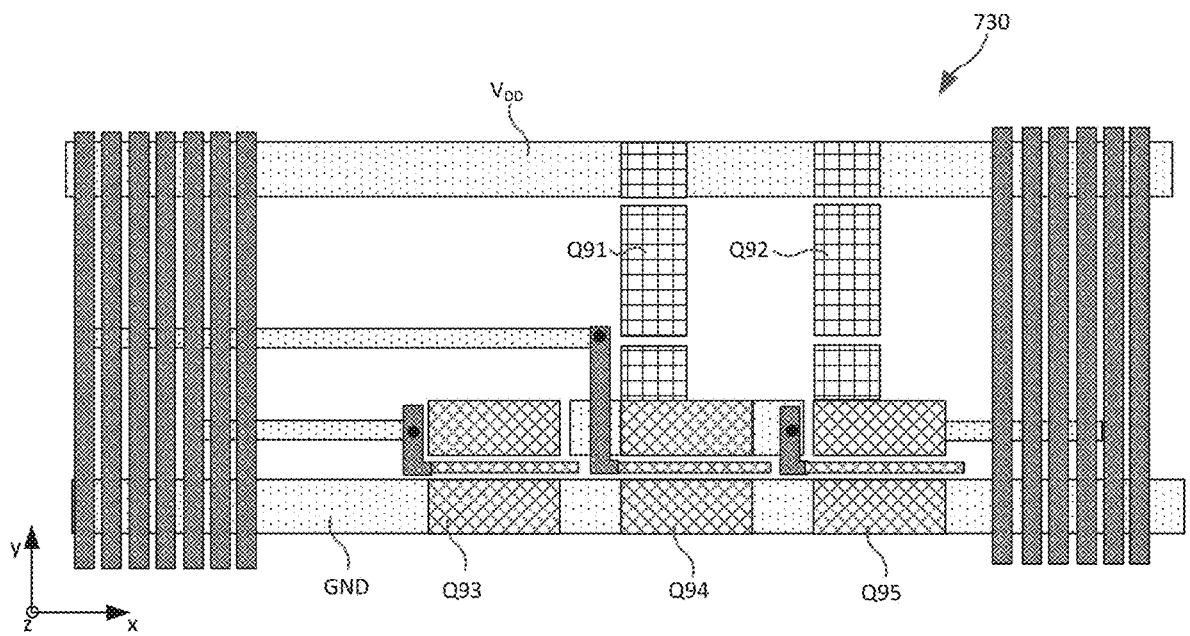
FIG. 11E is a greatly enlarged plan view of a third basic circuit element included in the implementation of the row address circuit portion of the row address circuitry of FIG. 11A
Figure 11F:
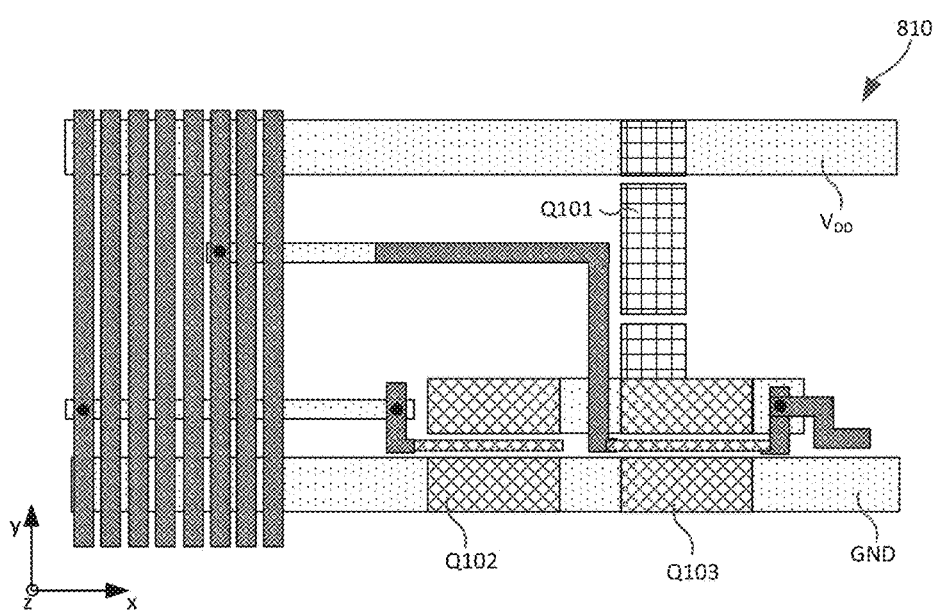
FIG. 11F is a greatly enlarged plan view of a basic circuit element included in the implementation of the decoder circuit portion of FIG. 11A.
Figure 11G:
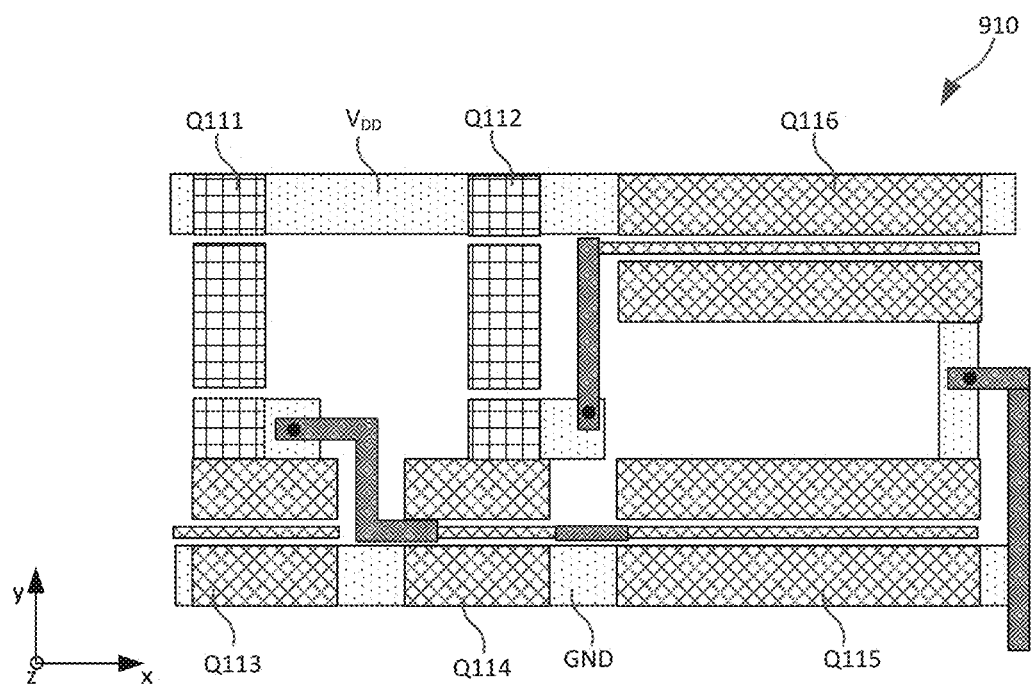
FIG. 11G is a greatly enlarged plan view of a basic circuit element included in the implementation of the word driver circuit portion of FIG. 11A.

FIGS. 11A-11G illustrate the row address circuitry included in the Group III nitride-based semiconductor device of FIGS. 2A-2C. The row address circuitry includes a row address buffer circuit 700, a decoder circuit 800 and a word driver circuit 900. FIG. 11A is a plan view of an implementation of the row address circuitry. FIG. 11B is a circuit diagram of selected portions of the row address circuitry of FIG. 11A. FIGS. 11C-11E are enlarged views of a first through third basic circuit elements that are included in the implementation of the row address buffer circuit 700 of FIG. 11A. Finally, FIG. 11F is an enlarged plan view of a basic circuit element of the decoder circuit 800, and FIG. 11G is an enlarged plan view of a basic circuit element of the word driver circuit 900.

As shown in FIG. 11A, the row address circuitry includes a row address buffer circuit 700, a decoder circuit 800 and a word driver circuit 900. The row address buffer circuit 700 includes a top portion 701 and a bottom portion 702. The top portion 701 is coupled to four inputs that receive a four bit row address that specifies one of the sixteen word lines in the SRAM block 150. The top portion 701 includes four first basic circuit elements 710 and four second basic circuit elements 720 that are coupled to the four row address inputs. Outputs of each first and second basic circuit element 710, 720 are coupled to the bottom portion 702 of the row address buffer circuit 700 via a plurality of vertically-extending conductive lines shown on the left side of FIG. 11A. The bottom portion 702 of the row address buffer circuit 700 includes eight third basic circuit elements 730. Outputs of the third basic circuit elements 730 are coupled to the decoder circuit 800 via a plurality of vertically-extending conductive lines shown running through the middle of FIG. 11A. The decoder circuit 800 includes sixteen instances of a decoder circuit element 810. The word driver circuit 900 includes sixteen instances of a word driver circuit element 910. The output of each decoder circuit element 810 is coupled to the input of a respective one of the word driver circuit elements 910. The output of each word driver circuit element 910 is coupled to a respective one of the word lines in the SRAM block 150.

FIG. 11B is a circuit diagram of (1) one instance of each of the basic circuit elements 710, 720, 730 of the row address buffer circuit 700, (2) one of the decoder circuit elements 810 of the decoder circuit 800 and (3) one of the word driver circuit elements 910 of the word driver circuit.

As shown in FIG. 11B, the first basic circuit element 710 of the row address buffer circuit 700 comprises depletion mode transistors Q71-Q73, enhancement mode transistors Q74-Q76, and a pair of diodes D77-D78. The first source/drain electrodes of depletion mode transistors Q71-Q73 are coupled to the power supply voltage source $V_{DD}$. The gate electrode and the second source/drain electrode of depletion mode transistor Q71 are commonly coupled to the first source/drain electrode of enhancement mode transistor Q74 and to a conductive line that connects to a respective one of the third basic circuit elements 730 of the row address buffer circuit 700. The gate electrode of enhancement mode transistor Q74 is coupled to the gate electrode and second source/drain electrode of depletion mode transistor Q72 and the first source/drain electrode of enhancement mode transistor Q75. The second source/drain electrode of enhancement mode transistor Q74 and the second source/drain electrode of enhancement mode transistor Q75 are coupled to ground. The gate electrode of enhancement mode transistor Q75 is commonly coupled to the gate electrode and second source/drain electrode of depletion mode transistor Q73 and to the first source/drain electrode of enhancement mode transistor Q76. The second source/drain electrode of enhancement mode transistor Q76 is coupled to ground. The gate electrode of enhancement mode transistor Q76 is coupled to one of the four row address inputs. The first basic circuit element 710 also includes a pair of diodes D77-D78 that provide electric discharge protection.

As is further shown in FIG. 11B, the second basic circuit element 720 of the row address buffer circuit 700 comprises depletion mode transistors Q81 and Q82, enhancement mode transistors Q83 and Q84, and a pair of diodes D85-D86. The first source/drain electrode of each of depletion mode transistors Q81-Q82 is coupled to the power supply voltage source $V_{DD}$. The gate electrode and the second source/drain electrode of depletion mode transistor Q81 are commonly coupled to the first source/drain electrode of enhancement mode transistor Q83 and to a conductive line that connects to a respective one of the third basic circuit elements 730 of the row address buffer circuit 700. The gate electrode of enhancement mode transistor Q83 is commonly coupled to the gate electrode and second source/drain electrode of depletion mode transistor Q82 and to the first source/drain electrode of enhancement mode transistor Q84. The second source/drain electrodes of enhancement mode transistors Q83 and Q84 are coupled to ground. The gate electrode of enhancement mode transistor Q84 is coupled to one of the four row address inputs. The second basic circuit element 720 also includes a pair of diodes D85-D86 that provide electric discharge protection.

As is also shown in FIG. 11B, the third basic circuit element 730 of the row address buffer circuit 700 comprises depletion mode transistors Q91 and Q92 and enhancement mode transistors Q93-Q95. The first source/drain electrodes of depletion mode transistors Q91-Q92 are coupled to the power supply voltage source $V_{DD}$. The gate electrodes of enhancement mode transistors Q93 and Q94 are each coupled to the top portion 701 of the row address buffer circuit. The second source/drain electrode of enhancement mode transistor Q93 and the second source/drain electrode of enhancement mode transistor Q94 are each coupled to ground. The first source/drain electrode of enhancement mode transistor Q93 is commonly coupled to the gate electrode and second source/drain electrode of depletion mode transistor Q91, to the first source/drain electrode of enhancement mode transistor Q94, and to the gate electrode of enhancement mode transistor Q95. The gate electrode and second source/drain electrode of depletion mode transistor Q92 are commonly coupled to the first source/drain electrode of enhancement mode transistor Q95 and to a respective pair of the decoder circuit elements 810 (discussed below). The second source/drain electrode of enhancement mode transistor Q95 is coupled to ground.

As is further shown in FIG. 11B, each decoder circuit element 810 includes a depletion mode transistor Q101 and a pair of enhancement mode transistors Q102, Q103. The first source/drain electrode of depletion transistor Q101 is coupled to the power supply voltage source $V_{DD}$ and the gate electrode and the second source/drain electrode of depletion mode transistor Q101 are commonly coupled to the first source/drain electrode of enhancement mode transistor Q102, to the first source/drain electrode of enhancement mode transistor Q103, and to a respective one of the word drive circuit elements 910 (discussed below). The gate electrodes of enhancement mode transistors Q102 and Q103 are coupled to the row address buffer circuit 700. The second source/drain electrodes of enhancement mode transistors Q102 and Q103 are coupled to ground.

Still referring to FIG. 11B, the word driver circuit element 910 includes depletion mode transistors Q111-Q113 and enhancement mode transistors Q114-Q116. The first source/drain electrodes of of depletion mode transistors Q111-Q113 are coupled to the power supply voltage source $V_{DD}$. The gate electrode and second source/drain electrode of depletion mode transistor Q111 are commonly coupled to the first source/drain electrode of enhancement mode transistor Q114 and to the gate electrodes of enhancement mode transistors Q115 and Q116. The gate electrode of enhancement mode transistor Q114 is coupled to a respective one of the buffer circuit elements 810, and the second source/drain electrode of enhancement mode transistor Q114 is coupled to ground. The gate electrode and second source/drain electrode of depletion mode transistor Q112 are commonly coupled to the gate electrode of depletion mode transistor Q113 and to the first source/drain electrode of enhancement mode transistor Q115. The second source/drain electrodes of enhancement mode transistors Q115 and Q116 are coupled to ground. Finally, the second source/drain electrode of depletion mode transistor Q113 and the first source/drain electrode of enhancement mode transistor Q116 are coupled to a respective one of the word lines.

FIG. 11C is an enlarged plan view of the first basic circuit element 710 of the row address buffer circuit 700 of FIGS. 11A and 11B. As shown in FIG. 11C, enhancement mode transistors Q74-Q76 may each have approximately the same gate periphery, and depletion mode transistors Q71-Q73 may each have approximately the same gate periphery. Enhancement mode transistors Q74-Q76 may all overlap in the x-direction, and in some embodiments the gate electrodes of enhancement mode transistors Q74-Q76 may be colinear. Depletion mode transistors Q71-Q73 may all overlap in the x-direction. Depletion mode transistor Q71 may overlap enhancement mode transistor Q74 in the y-direction, depletion mode transistor Q72 may overlap enhancement mode transistor Q75 in the y-direction, and depletion mode transistor Q73 may overlap enhancement mode transistor Q76 in the y-direction.

The gate electrodes of enhancement mode transistors Q74-Q76 may extend in the x-direction, while the gate electrode of depletion mode transistors Q71-Q73 may extend in the y-direction so that the gate electrodes of the enhancement mode transistors Q74-Q76 extend substantially perpendicular to the gate electrodes of the depletion mode transistors Q71-Q73.

FIG. 11D is an enlarged plan view of the second basic circuit element 720 of the row address buffer circuit 700 of FIGS. 11A and 11B. As shown in FIG. 11D, enhancement mode transistors Q83 and Q84 may each have approximately the same gate periphery, and depletion mode transistors Q81 and Q82 may each have approximately the same gate periphery. Enhancement mode transistors Q83 and Q84 may overlap in the x-direction, and in some embodiments the gate electrodes of enhancement mode transistors Q83 and Q84 may be colinear. Depletion mode transistors Q81-Q82 may overlap in the x-direction. Depletion mode transistor Q81 may overlap enhancement mode transistor Q83 in the y-direction, and depletion mode transistor Q82 may overlap enhancement mode transistor Q84 in the y-direction. The gate electrodes of enhancement mode transistors Q83 and Q84 may extend in the x-direction, while the gate electrode of depletion mode transistors Q81 and Q82 may extend in the y-direction so that the gate electrodes of the enhancement mode transistors Q83-Q84 extend substantially perpendicular to the gate electrodes of the depletion mode transistors Q81-Q82.

FIG. 11E is an enlarged plan view of the third basic circuit element 730 of the row address buffer circuit 700 of FIGS. 11A and 11B. As shown in FIG. 11E, enhancement mode transistors Q93 through Q95 may each have approximately the same gate periphery, and depletion mode transistors Q91 and Q92 may each have approximately the same gate periphery. All three enhancement mode transistors Q93-Q95 may overlap in the x-direction, and in some embodiments the gate electrodes of enhancement mode transistors Q93-Q95 may be colinear. Depletion mode transistors Q91-Q92 may overlap in the x-direction. Depletion mode transistor Q91 may overlap enhancement mode transistor Q94 in the y-direction, and depletion mode transistor Q92 may overlap enhancement mode transistor Q95 in the y-direction. The gate electrodes of enhancement mode transistors Q93-Q95 may extend in the x-direction, while the gate electrode of depletion mode transistors Q91 and Q92 may extend in the y-direction so that the gate electrodes of the enhancement mode transistors Q93-Q95 extend substantially perpendicular to the gate electrodes of the depletion mode transistors Q91-Q92

FIG. 11F is an enlarged plan view of the circuit element 810 of the decoder circuit 800 of FIGS. 11A and 11B. As shown in FIG. 11F, enhancement mode transistors Q102 and Q103 of the row decoder circuit element 810 may have approximately the same gate periphery, and may overlap in the x-direction. The gate electrodes of enhancement mode transistors Q102 and Q103 may be colinear in some embodiments. The gate electrode of depletion mode transistor Q101 may extend in the y-direction to extend substantially perpendicular to the gate electrodes of enhancement mode transistors Q102 and Q103.

FIG. 11G is an enlarged plan view of the circuit element 910 of the word driver circuit 900 of FIGS. 11A and 11B. As shown in FIG. 11G, enhancement mode transistors Q113 and Q114 of the word driver circuit 910 may have approximately the same gate periphery, and enhancement mode transistors Q115 and Q116 may have approximately the same gate periphery. The gate periphery of each of transistors Q115 and Q116 may be substantially larger than (e.g., at least twice as large) the gate periphery of each of transistors Q113 and Q114. Each of the depletion mode transistors Q111-Q112 may have approximately the same gate periphery. Enhancement mode transistors Q113-Q115 may all overlap in the x-direction. Transistors Q111 and Q113 may overlap in the y-direction, transistors Q112 and Q114 may overlap in the y-direction, and transistors Q115 and Q116 may overlap in the y-direction. The gate electrodes of each enhancement mode transistor Q113-Q116 may extend in the x-direction, while the gate electrodes of depletion mode transistors Q111 and Q112 may extend in the y-direction so that the gate electrodes of depletion mode transistors Q111 and Q112 extend substantially perpendicular to the gate electrodes of enhancement mode transistors Q113-Q116.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. A monolithic microwave integrated circuit, comprising:
a monolithic substrate;
a Group III nitride-based barrier layer on the monolithic substrate;
a Group III nitride-based channel layer in between the monolithic substrate and the Group III nitride-based barrier layer;
a radio frequency ("RF") circuit that includes a plurality of depletion mode RF transistors that are formed in the Group III nitride-based channel and barrier layers; and
a static random access memory ("SRAM") circuit that includes a SRAM block having a plurality of SRAM cells arranged in rows and columns, the SRAM circuit including a plurality of depletion mode transistors and a plurality of enhancement mode transistors that are formed in the Group III nitride-based channel and barrier layers.

2. The monolithic microwave integrated circuit of claim 1, wherein the SRAM circuit includes a first input buffer circuit, a first column enable circuit, a first sense amplifier and a first sense amplifier buffer circuit that each include a plurality of depletion mode RF transistors and a plurality of enhancement mode RF transistors that are formed in the Group III nitride-based channel and barrier layers.

3. The monolithic microwave integrated circuit of claim 1, wherein the first input buffer circuit, the first column enable circuit, the first sense amplifier and the first sense amplifier buffer circuit are arranged in a column that extends from a first column of SRAM cells in the SRAM block, with the first sense amplifier buffer circuit directly adjacent the first column of memory cells, and the first sense amplifier and the first column enable circuit are in between the first sense amplifier buffer circuit and the first input buffer circuit.

4. The monolithic microwave integrated circuit of claim 3, wherein a first portion of the first column enable circuit is in between the first input buffer circuit and the first sense amplifier.

5. The monolithic microwave integrated circuit of claim 4, wherein a second portion of the first column enable circuit is positioned within a footprint of the first sense amplifier.

6. The monolithic microwave integrated circuit of claim 3, wherein the first input buffer circuit comprises first through eight enhancement mode transistors, each of which have respective gate electrodes that extend in a first direction, and first and second depletion mode transistors, each of which have respective gate electrodes that extend in a second direction that is perpendicular to the first direction.

7. The monolithic microwave integrated circuit of claim 6, wherein the first through fourth enhancement mode transistors are aligned along a first axis that extends in the first direction, and wherein the fifth through eighth enhancement mode transistors are arranged to define a rectangle.

8. The monolithic microwave integrated circuit of claim 3, wherein the first column enable circuit comprises first through third enhancement mode transistors, each of which have respective gate electrodes that extend in a first direction, and first through fourth depletion mode transistors, each of which have respective gate electrodes that extend in a second direction that is perpendicular to the first direction.

9. The monolithic microwave integrated circuit of claim 8, wherein gate electrodes of the first through third enhancement mode transistors are aligned along a third axis that extends in the first direction.

10. The monolithic microwave integrated circuit of claim 9, wherein the first and second depletion mode transistors are on a first side of the third axis and the third and fourth depletion mode transistors are on a second side of the third axis that is opposite the first side.

11. The monolithic microwave integrated circuit of claim 9, wherein at least part of a first enhancement mode transistor of the first sense amplifier is positioned between the third axis and the fourth depletion mode transistor of the first column enable circuit, and at least part of a second enhancement mode transistor of the first sense amplifier is positioned between the third axis and the third depletion mode transistor of the first column enable circuit.

12. The monolithic microwave integrated circuit of claim 11, wherein the third and fourth depletion mode transistors of the first column enable circuit are positioned between a fourth axis defined by the gate electrodes of the first and second enhancement mode transistors of the sense amplifier and a fifth axis defined by a longitudinal axis of the third enhancement mode transistor of the sense amplifier.

13. The monolithic microwave integrated circuit of claim 12, wherein the first enhancement mode transistor of the sense amplifier is electrically coupled in series along the complementary bit line and the second enhancement mode transistor of the sense amplifier is electrically coupled in series along the bit line.

14. The monolithic microwave integrated circuit of claim 13, wherein the first and second enhancement mode transistors of the sense amplifier are aligned along the fourth axis, and the fourth and fifth enhancement mode transistors of the sense amplifier are aligned along a sixth axis that extends in the first direction.

15. The monolithic microwave integrated circuit of claim 14, wherein a first part of a source/drain electrode of the third enhancement mode transistor of the sense amplifier comprises a second source/drain electrode of the fourth enhancement mode transistor of the sense amplifier, and a second part of the first source/drain electrode of the third enhancement mode transistor of the sense amplifier comprises a second source/drain electrode of the fifth enhancement mode transistor of the sense amplifier.

16. The monolithic microwave integrated circuit of claim 3, wherein the first sense amplifier buffer circuit comprises first through seventh enhancement mode transistors, each of which have respective gate electrodes that extend in a first direction, and first and second depletion mode transistors, each of which have respective gate electrodes that extend in a second direction that is perpendicular to the first direction.

17. The monolithic microwave integrated circuit of claim 16, wherein the seventh enhancement mode transistor of the first sense amplifier buffer circuit overlaps the first through sixth enhancement mode transistors of the first sense amplifier buffer circuit in the second direction.

18. The monolithic microwave integrated circuit of claim 16, further comprising a first pre-charge depletion mode transistor that has a gate electrode that is coupled to a gate electrode of the first enhancement mode transistor of the first sense amplifier buffer circuit and a second pre-charge depletion mode transistor that has a gate electrode that is coupled to a gate electrode of the second enhancement mode transistor of the first sense amplifier buffer circuit.

19. The monolithic microwave integrated circuit of claim 18, wherein the first through seventh enhancement mode transistors and the first and second depletion mode transistors of the first sense amplifier buffer circuit are positioned in a region between the first bit line and the first complementary bit line, while the first pre-charge depletion mode transistor and the second pre-charge depletion mode transistor are positioned outside the region between the first bit line and the first complementary bit line.

20. The monolithic microwave integrated circuit of claim 1, wherein a first of the SRAM cells includes first through fourth enhancement mode transistors and first and second depletion mode transistors, wherein the third and fourth enhancement mode transistors are positioned in between the first and second depletion mode transistors.

21. The monolithic microwave integrated circuit of claim 20, wherein gate electrodes of the first through fourth enhancement mode transistors each extend in a first direction, and the first enhancement mode transistor overlaps the third enhancement mode transistor in a second direction that is perpendicular to the first direction.

22. The monolithic microwave integrated circuit of claim 21, wherein the bit line extends between the first depletion mode transistor and the third enhancement mode transistor, and the complementary bit line extends between the second depletion mode transistor and the fourth enhancement mode transistor.

23. A monolithic microwave integrated circuit, comprising:
- a monolithic substrate;
- a Group III nitride-based barrier layer on the monolithic substrate;
- a Group III nitride-based channel layer in between the monolithic substrate and the Group III nitride-based barrier layer; and
- a static random access memory ("SRAM") circuit that includes a SRAM block having a column of SRAM cells and a first bit line and a first complementary bit line that electrically connected to each SRAM cell in the column of SRAM cells,
- wherein a first of the SRAM cells includes first through fourth enhancement mode transistors and first and second depletion mode transistors that are formed in the Group III nitride-based channel and barrier layers, and
- wherein the first bit line extends between the first depletion mode transistor and the third enhancement mode transistor and the first complementary bit line extends between the second depletion mode transistor and the fourth enhancement mode transistor.

24. The monolithic microwave integrated circuit of claim 23, wherein gate electrodes of the first through fourth enhancement mode transistors each extend in a first direction, and the first enhancement mode transistor overlaps the third enhancement mode transistor in a second direction that is perpendicular to the first direction.

25. The monolithic microwave integrated circuit of claim 24, wherein the second enhancement mode transistor overlaps the fourth enhancement mode transistor in the second direction.

26. The monolithic microwave integrated circuit of claim 25, wherein the first enhancement mode transistor overlaps the second enhancement mode transistor in the first direction, and the third enhancement mode transistor overlaps the fourth enhancement mode transistor in the first direction.

* * * * *

UNITED STATES PATENT AND TRADEMARK OFFICE
CERTIFICATE OF CORRECTION

PATENT NO. : 12,315,830 B2
APPLICATION NO. : 17/737431
DATED : May 27, 2025
INVENTOR(S) : Jeremy Fisher It is certified that error appears in the above-identified patent and that said Letters Patent is hereby corrected as shown below:

In the Specification

Column 11, Line 66: Please correct "$0{\leq}x<1$." to read --$0{\leqq}x<1$.--

Column 16, Line 15: Please correct "they-direction," to read --the y-direction,--

Column 23, Line 50: Please correct "FIG. 111B," to read --FIG. 11B,--

Column 23, Line 65: Please correct "FIG. 111B," to read --FIG. 11B,--

Signed and Sealed this
Sixteenth Day of September, 2025

Coke Morgan Stewart
*Acting Director of the United States Patent and Trademark Office*